(12) United States Patent
Huang et al.

(10) Patent No.: US 11,031,478 B2
(45) Date of Patent: Jun. 8, 2021

(54) SEMICONDUCTOR DEVICE HAVING BODY CONTACTS WITH DIELECTRIC SPACERS AND CORRESPONDING METHODS OF MANUFACTURE

(71) Applicant: Infineon Technologies Austria AG, Villach (AT)

(72) Inventors: Wei-Chun Huang, Torrance, CA (US); Martin Poelzl, Ossiach (AT); Thomas Feil, Villach (AT); Maximilian Roesch, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/878,183

(22) Filed: Jan. 23, 2018

(65) Prior Publication Data

US 2019/0229198 A1 Jul. 25, 2019

(51) Int. Cl.
*H01L 29/10* (2006.01)
*H01L 29/423* (2006.01)
(Continued)

(52) U.S. Cl.
CPC ...... *H01L 29/423* (2013.01); *H01L 21/76805* (2013.01); *H01L 21/76831* (2013.01);
(Continued)

(58) Field of Classification Search
CPC ... H01L 29/402; H01L 29/404; H01L 29/407; H01L 29/7811; H01L 29/7823;
(Continued)

(56) References Cited

U.S. PATENT DOCUMENTS 5,216,275 A 6/1993 Chen
6,462,377 B2 10/2002 Hurkx et al.
(Continued)

FOREIGN PATENT DOCUMENTS

DE 102015112434 A1 2/2016
EP 1755168 A2 2/2007
(Continued)

OTHER PUBLICATIONS

Feil, Thomas, "Transistor Device with a Field Electrode that Includes Two Layers", U.S. Appl. No. 15/663,903, filed Jul. 31, 2017.

*Primary Examiner* — Bitew A Dinke
(74) *Attorney, Agent, or Firm* — Murphy, Bilak & Homiller, PLLC

(57) ABSTRACT

A semiconductor device includes a trench extending into a first main surface of a semiconductor substrate, and a gate electrode and a gate dielectric in the trench. The gate dielectric separates the gate electrode from the semiconductor substrate. A first region having a first conductivity type is formed in the semiconductor substrate at the first surface adjacent the trench. A second region having a second conductivity type is formed in the semiconductor substrate below the first region adjacent the trench. A third region having the first conductivity type is formed in the semiconductor substrate below the second region adjacent the trench. A contact opening in the semiconductor substrate extends into the second region. An electrically insulative spacer is disposed on sidewalls of the semiconductor substrate formed by the contact opening, and an electrically conductive material in the contact opening adjoins the electrically insulative spacer on the sidewalls.

28 Claims, 31 Drawing Sheets

(51) Int. Cl.
| | |
|---|---|
| *H01L 29/40* | (2006.01) |
| *H01L 29/66* | (2006.01) |
| *H01L 29/78* | (2006.01) |
| *H01L 29/417* | (2006.01) |
| *H01L 29/06* | (2006.01) |
| *H01L 29/08* | (2006.01) |
| *H01L 21/768* | (2006.01) |
| *H01L 27/06* | (2006.01) |
| *H01L 29/739* | (2006.01) |
| *H01L 29/872* | (2006.01) |

(52) U.S. Cl.
CPC ...... *H01L 27/0629* (2013.01); *H01L 29/0634* (2013.01); *H01L 29/0869* (2013.01); *H01L 29/1095* (2013.01); *H01L 29/407* (2013.01); *H01L 29/41741* (2013.01); *H01L 29/41766* (2013.01); *H01L 29/6634* (2013.01); *H01L 29/66719* (2013.01); *H01L 29/66727* (2013.01); *H01L 29/7806* (2013.01); *H01L 29/7813* (2013.01); *H01L 29/7843* (2013.01); H01L 29/66348 (2013.01); H01L 29/66734 (2013.01); H01L 29/7397 (2013.01); H01L 29/872 (2013.01)

(58) Field of Classification Search
CPC ............... H01L 29/7825; H01L 29/423; H01L 29/66727; H01L 21/76805; H01L 21/76831; H01L 29/41741; H01L 27/0629; H01L 29/6634; H01L 29/1095; H01L 29/7843; H01L 29/7813; H01L 29/7397; H01L 29/872; H01L 29/66348; H01L 29/66734
See application file for complete search history.

(56) References Cited

U.S. PATENT DOCUMENTS

| | | | |
|---|---|---|---|
| 7,504,690 B2 | 3/2009 | Kelly et al. | |
| 7,851,349 B2 * | 12/2010 | Rieger | H01L 29/1095 438/620 |
| 8,362,550 B2 | 1/2013 | Rexer et al. | |
| 9,006,822 B2 | 4/2015 | Peake et al. | |
| 10,243,051 B2 | 3/2019 | Feil | |
| 10,720,500 B2 | 7/2020 | Feil | |
| 2007/0013000 A1 * | 1/2007 | Shiraishi | H01L 29/0634 257/341 |
| 2007/0093019 A1 * | 4/2007 | Rieger | H01L 29/1095 438/243 |
| 2007/0108511 A1 | 5/2007 | Hirler | |
| 2007/0114599 A1 | 5/2007 | Hshieh | |
| 2007/0170549 A1 * | 7/2007 | Tsuzuki | H01L 27/0664 257/565 |
| 2008/0135929 A1 * | 6/2008 | Saito | H01L 29/0634 257/330 |
| 2009/0057757 A1 | 3/2009 | Hokomoto et al. | |
| 2009/0079002 A1 * | 3/2009 | Lee | H01L 29/0634 257/355 |
| 2009/0189218 A1 * | 7/2009 | Pan | H01L 29/7813 257/330 |
| 2009/0256197 A1 | 10/2009 | Nakazawa et al. | |
| 2010/0078707 A1 * | 4/2010 | Haeberlen | H01L 29/7805 257/328 |
| 2011/0059586 A1 * | 3/2011 | Akiyama | H01L 29/0634 438/270 |
| 2011/0136309 A1 * | 6/2011 | Grivna | H01L 29/407 438/270 |
| 2011/0169081 A1 * | 7/2011 | Ishikawa | H01L 21/02381 257/341 |
| 2011/0254088 A1 * | 10/2011 | Darwish | H01L 29/66727 257/340 |
| 2012/0313161 A1 * | 12/2012 | Grivna | H01L 29/7842 257/330 |
| 2012/0319199 A1 * | 12/2012 | Zeng | H01L 29/66727 257/334 |
| 2013/0153995 A1 | 6/2013 | Misawa et al. | |
| 2013/0161742 A1 * | 6/2013 | Cho | H01L 29/66712 257/341 |
| 2014/0077290 A1 * | 3/2014 | Hsieh | H01L 21/26586 257/330 |
| 2014/0206162 A1 * | 7/2014 | Eguchi | H01L 29/66712 438/268 |
| 2015/0053999 A1 | 2/2015 | Kumagai | |
| 2015/0076600 A1 * | 3/2015 | Jun | H01L 21/265 257/339 |
| 2016/0079376 A1 | 3/2016 | Hirler et al. | |
| 2017/0179225 A1 * | 6/2017 | Lee | H01L 29/0688 |
| 2018/0012956 A1 * | 1/2018 | Ohashi | H01L 21/0465 |
| 2018/0083128 A1 * | 3/2018 | Yokoyama | H01L 21/8249 |
| 2019/0081147 A1 * | 3/2019 | West | H01L 29/42368 |

FOREIGN PATENT DOCUMENTS

| | | |
|---|---|---|
| KR | 20050006283 A | 1/2005 |
| KR | 20160026772 A | 3/2016 |
| KR | 20160073143 A | 6/2016 |
| WO | 2009079465 A1 | 6/2009 |
| WO | 2010132283 A1 | 11/2010 |

* cited by examiner

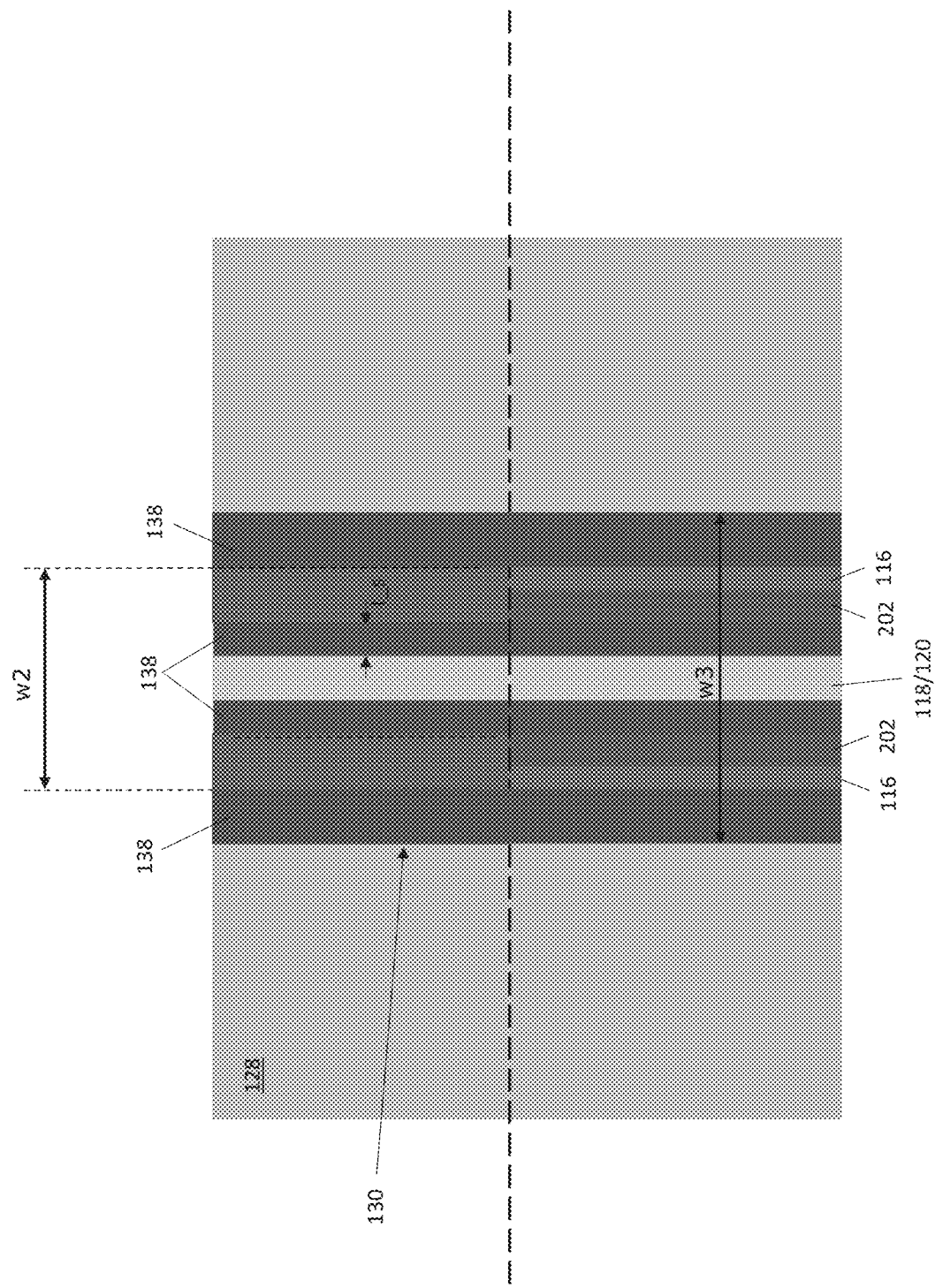

SEMICONDUCTOR DEVICE HAVING BODY CONTACTS WITH DIELECTRIC SPACERS AND CORRESPONDING METHODS OF MANUFACTURE

BACKGROUND

The channel dimensions of power MOSFETs are routinely reduced to increase performance. The distance between the channel and the groove contact to the body region of the device also becomes smaller, resulting in several crucial trade-offs including: the interaction of the p+ contact implant into the groove with channel dopants; and the slope of the threshold voltage characteristic decreases as parasitic source capacitance increases and gate control is reduced by depletion capacitance.

The distance between the channel and the groove contact can be kept large enough, but this results in higher Rdson (on-state resistance). The decrease in the slope of the threshold voltage characteristic can be addressed by using thinner oxide which yields smaller gate capacitance. However, smaller gate capacitance increases gate total charge Figure of Merit (FOMg).

Hence, new power MOSFETs with smaller channel dimensions and acceptable FOMg are needed.

SUMMARY

According to an embodiment of a semiconductor device, the semiconductor device comprises: a trench extending into a first main surface of a semiconductor substrate; a gate electrode and a gate dielectric in the trench, the gate dielectric separating the gate electrode from the semiconductor substrate; a first region having a first conductivity type formed in the semiconductor substrate at the first surface and adjacent the trench; a second region having a second conductivity type formed in the semiconductor substrate below the first region and adjacent the trench; a third region having the first conductivity type formed in the semiconductor substrate below the second region and adjacent the trench; a contact opening in the semiconductor substrate which extends into the second region; an electrically insulative spacer on side ails of the semiconductor substrate formed by the contact opening; and an electrically conductive material in the contact opening and adjoining the electrically insulative spacer on the sidewalls of the semiconductor substrate formed by the contact opening. Corresponding methods of manufacture are also provided, Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts, The features of the various illustrated embodiments can be combined unless they exclude each other. Embodiments are depicted in the drawings and are detailed in the description which follows.

FIG. 6 illustrates a partial top plan view of the semiconductor device embodiments shown in FIGS. 1 through 4.

DETAILED DESCRIPTION

The embodiments described herein provide power MOSFETs with reduced channel dimensions and good FOMg, and corresponding methods of manufacture. By introducing a spacer dielectric along sidewalls of the contact to the highly-doped body contact region of a power device, the lateral dimension of the channel region can be further reduced while also reducing source capacitance and increasing the distance between the highly-doped body contact region and the channel region. The small fin-like portion of the device body region between the contact opening/groove in the semiconductor substrate and the gate trench is in parallel with the contact opening/groove, reducing the swing of the IV curve and DIBL (drain-induced barrier lowering). The highly-doped body contact region is decoupled from the channel region by the spacer dielectric along the contact opening/groove, improving threshold voltage stability. The dielectric spacer also introduces stress along the channel side, which should reduce Rdson and leakage.

Figure 1:
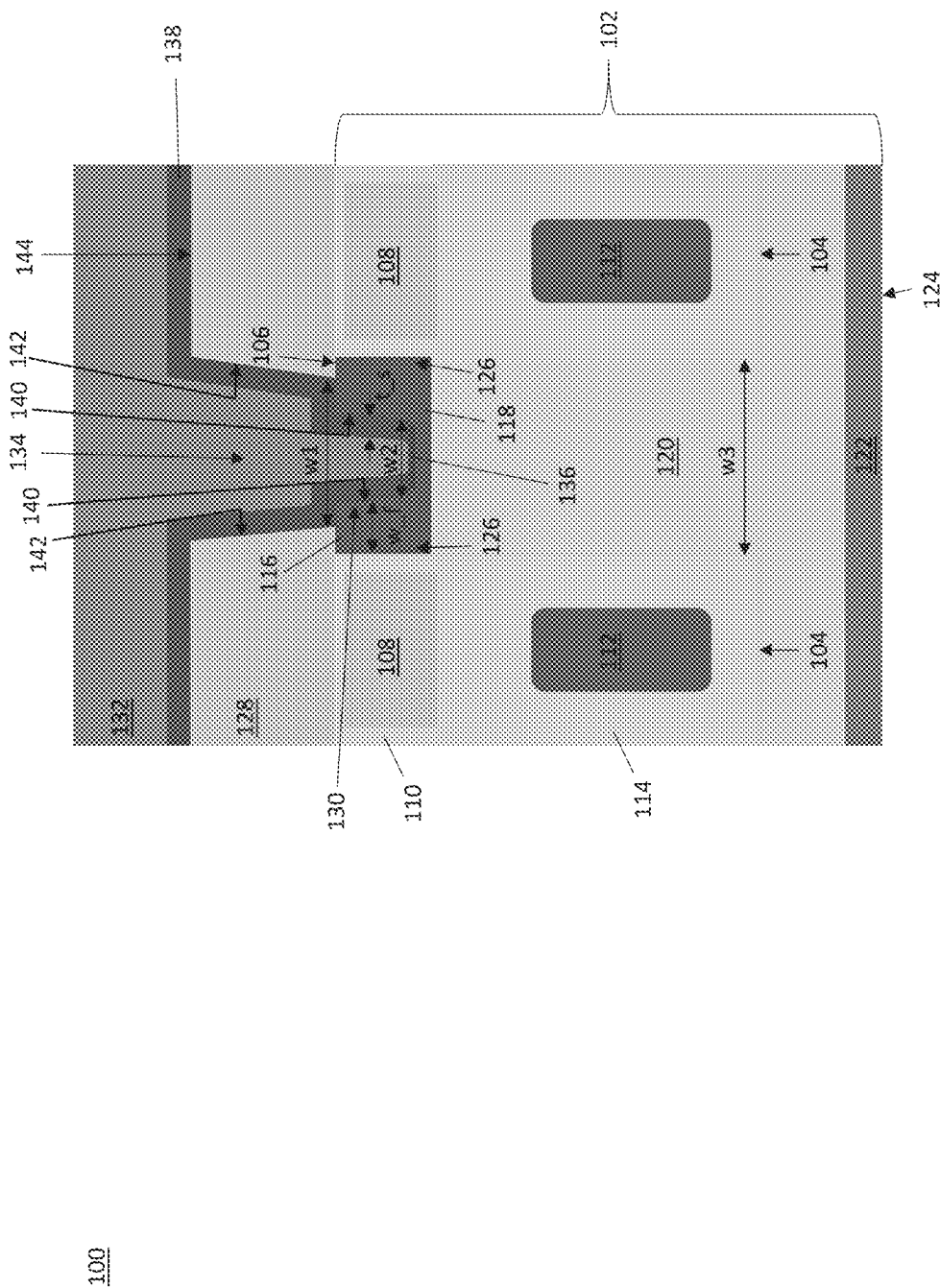
FIGS. 1 through 4 illustrate respective partial cross-sectional views of embodiments of semiconductor devices having body contacts with dielectric spacers.

FIG. 1 illustrates a partial cross-sectional view of a semiconductor device 100 having body contacts with dielectric spacers. The semiconductor device 100 includes a semiconductor substrate 102 with gate trenches 104 extending into the front surface 106 of the semiconductor substrate 102. The semiconductor substrate 102 can comprise any type of semiconductor material such as a single element semiconductor (e.g. Si, Ge, etc.), silicon-on-insulator, a binary semiconductor (e.g. SiC, GaN, GaAs, etc.), a ternary semiconductor, etc. with or without epitaxial layer(s). A gate electrode 108 and a gate dielectric 110 are disposed in each gate trench 104, the gate dielectric 110 separating the corresponding gate electrode 108 from the semiconductor substrate 102. A field plate 112 can be disposed in the gate trenches 104 below the gate electrodes 108, each field plate 112 being separated from the semiconductor substrate 102 and the corresponding gate electrode 108 by a field dielectric 114 that is thicker than the gate dielectric 110. Alternatively or additionally, field plates can be disposed in dedicated field plate trenches which are not shown in FIG. 1.

A first (source/emitter) region 116 having a first conductivity type (e.g. n-type in the case of an n-channel device, or p-type in the case of a p-channel device) is formed in the semiconductor substrate 102 at the front surface 106 and adjacent each gate trench 104. A second (body) region 118 having a second conductivity type (e.g. p-type in the case of an 11-channel device, or n-type in the case of a p-channel device) is formed in the semiconductor substrate 102 below the source/emitter region 116 and adjacent each gate trench 104. A third (drift) region 120 having the first conductivity type is formed in the semiconductor substrate 102, e.g. as part of an epitaxial layer, below the body region 118 and adjacent each gate trench 104. A drain/collector region 122 of the first conductivity type is formed at the back surface 124 of the semiconductor substrate 102 opposite the front surface 106, and is doped more heavily than the drift region 120.

The semiconductor device 100 shown in FIG. 1 is a vertical power MOSFET which has a channel region 126 that extends in the vertical direction along gate dielectric 110 in the body region 118. By applying a sufficient gate voltage to the gate electrodes 108, minority carriers (electrons in the case of a p-type body region 118, or holes in the case of an n-type body region 118) collect along the gate dielectric 110 in the channel region 126 and an electrically conductive path is completed between the source/emitter region 116 and the drain/collector region 122 via the drift and channel regions 120, 126.

An interlayer dielectric 128 such a silicon dioxide, silicon nitride, tetraethoxysilane (TEOS), etc. is formed on the front surface 106 of the semiconductor substrate 102 to separate one or more overlying metal layers (not shown) from the underlying semiconductor substrate 102. A contact opening 130 extends through the interlayer dielectric 128 and into the semiconductor substrate 102. In one embodiment, the minimum width (w1) of the contact opening 130 is larger in the interlayer dielectric 128 than the minimum width (w2) of the contact opening 130 in the semiconductor substrate 102. The width of the drift region 120 between adjacent gate trenches 104 is labelled w3 in FIG. 1, and which can be in the range of several hundred nanometres, e.g. about 300 nm or more or less. The part of the contact opening 130 formed in the semiconductor substrate 102 is also referred to herein as a groove. An electrically conductive material 132 fills the contact opening 130 to form a body contact plug 134 having a stepped profile in the contact opening 130 due to the width difference described above (w1>w2).

The contact opening 130 extends at least into the body region 118. In the embodiment illustrated in FIG. 1, the contact opening 130 terminates within the body region 118 so that the body contact plug 134 is separated from the drift region 120 by a section of the body region 118. A highly-doped (e.g. p+) body contact region 136 of the second conductivity type, and which is doped more heavily than the body region 118, is formed in the body region 118 adjacent the bottom of the contact opening 130. The highly-doped body contact region 136 adjoins, and is in ohmic contact with, the body contact plug 134 at the bottom of the contact opening 130.

An electrically insulative spacer 138 is disposed on sidewalls 140 of the semiconductor substrate 102 formed by the contact opening 130. The electrically conductive material 132 in the contact opening 130 adjoins the electrically insulative spacer 138 on the sidewalls 140 of the semiconductor substrate 102 formed by the contact opening 130. By providing the electrically insulative spacer 138 along the sidewalls 140 of the semiconductor substrate 102 formed by the contact opening 130, the lateral dimension of the channel regions 126 can be reduced while also reducing source capacitance and increasing the distance between the body contact plug 134 and the channel regions 126. As a result, the body contact plug 134 is better decoupled from the channel regions 126 by the electrically insulative spacer 138 disposed on the sidewalls 140 of the semiconductor substrate 102 formed by the contact opening 130. Any suitable electrically insulating material can be used for the electrically insulative spacer 140, such as oxide, nitride, carbon, TEOS, etc.

According to the embodiment shown in FIG. 1, the electrically insulative spacer 138 extends onto the front surface 106 of the semiconductor substrate 102, along sidewalls 142 of the interlayer dielectric 128 formed by the contact opening 130, and onto the surface 144 of the interlayer dielectric 128 facing away from the semiconductor substrate 102. With such a contact groove spacer configuration, the ohmic contact between the highly-doped body contact region 136 formed in the semiconductor substrate 102 and the body contact plug 134 occurs only at the bottom of the contact opening 130. As previously described herein, the semiconductor substrate 102 can include one or more epitaxial layers such as Si epitaxial layers. For example, the heavily doped drain/collector region 122 may have been fabricated from a semiconductor wafer and the body region 118 and the drift region 120 can be formed in one or more epitaxial layers grown on the heavily doped drain/collector region 122.

Figure 2:
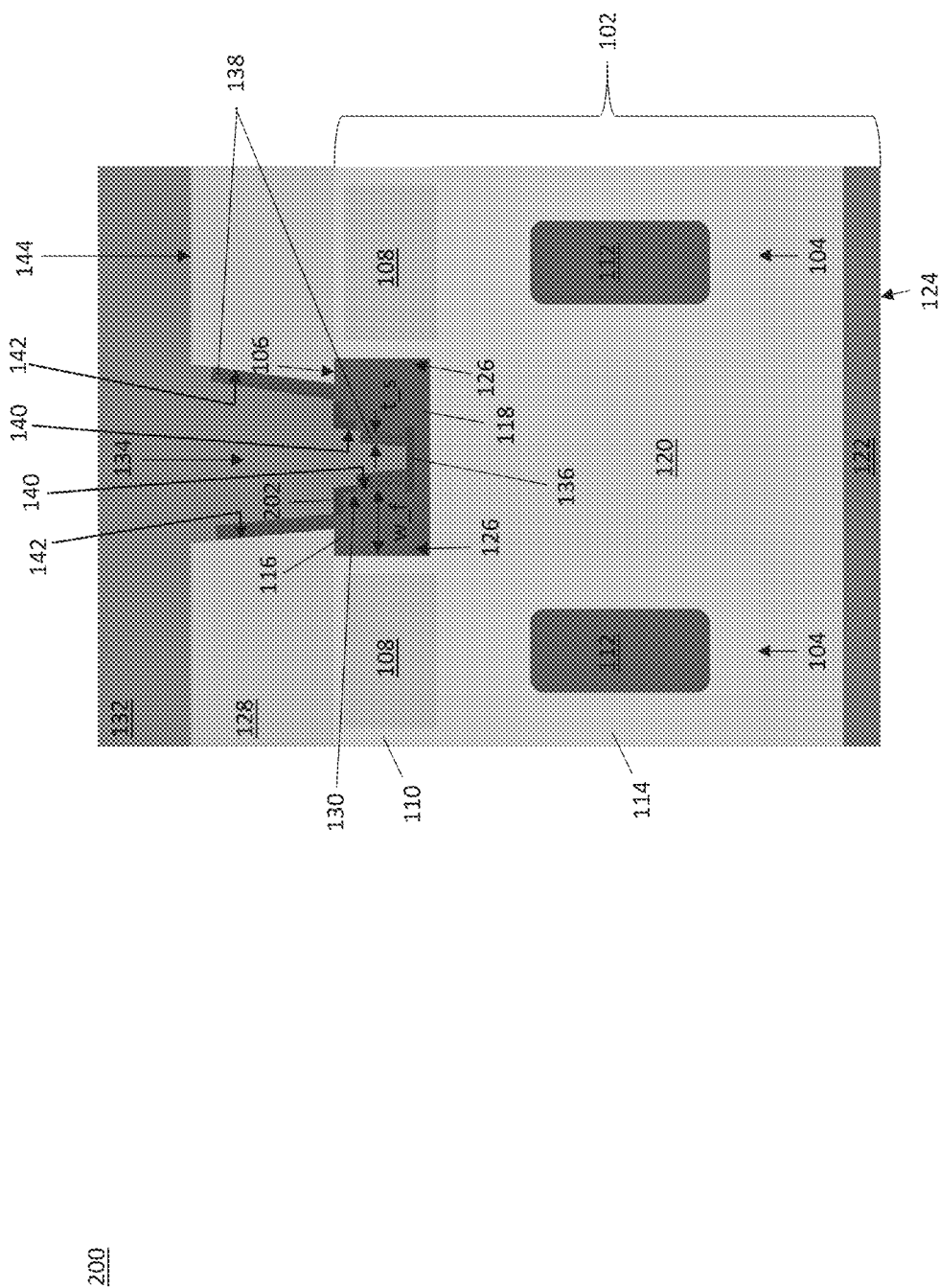

FIG. 2 illustrates a partial cross-sectional view of another embodiment of a semiconductor device 200 having a buried dielectric plug. The embodiment shown in FIG. 2 is similar to the embodiment shown in FIG. 1. Different, however, the portion of the electrically insulative spacer 138 disposed in the contact opening 130 is recessed below the front surface 106 of the semiconductor substrate 102 along the sidewalls 140 of the semiconductor substrate 102 formed by the contact opening 130. According to this embodiment, the electrically insulative spacer 138 is recessed before formation of the highly-doped body contact region 136. As a result, the part of the source/collector region 116 exposed as a result of the removal of the electrically insulative spacer 138 in select regions is implanted during the body contact formation process. After a corresponding anneal process, a first highly-doped body contact region 136 of the second conductivity type, which is doped more heavily than the body region 118, is formed in the body region 118 adjacent the bottom of the contact opening 130. A second highly-doped body contact region 202 of the second conductivity type can be formed in the part of the source/collector region 116 exposed as a result of the selective removal of the electrically insulative spacer 138. The first highly-doped body contact region 136 adjoins, and is in ohmic contact with, the body contact plug 134 at the bottom of the contact opening 130, whereas the second highly-doped body contact region 202 adjoins, and is in ohmic contact with, the body contact plug 134 along the part of the contact opening 130 devoid of the electrically insulative spacer 138. A variation of the embodiment shown in FIG. 2 can omit the second highly-doped body contact region 202, so that the source/collector region 116 is at least partly uncovered by the electrically insulative spacer 138 along the sidewalls of the contact opening 130 and possibly along part of the front surface 106 of the semiconductor substrate 102. For example, the first highly-doped body contact region 136 can be formed by implantation (e.g. p+) at the bottom of the contact opening 130. Some of the dopant species being implanted may also reach uncovered portions of the sidewalls of the contact opening 130. In a first option, uncovered portions of the source/collector region 116 are implanted and include highly-doped contact region 202 in the final product. In a second option, the implantation does not essentially affect the doping of the source/collector 116 so that the final product does not include the highly-doped contact region 202, but has an overall (net) doping concentration sufficient to function as a source/collector for the device and to make sure that good ohmic contact (e.g. n+) is maintained.

Figure 3:
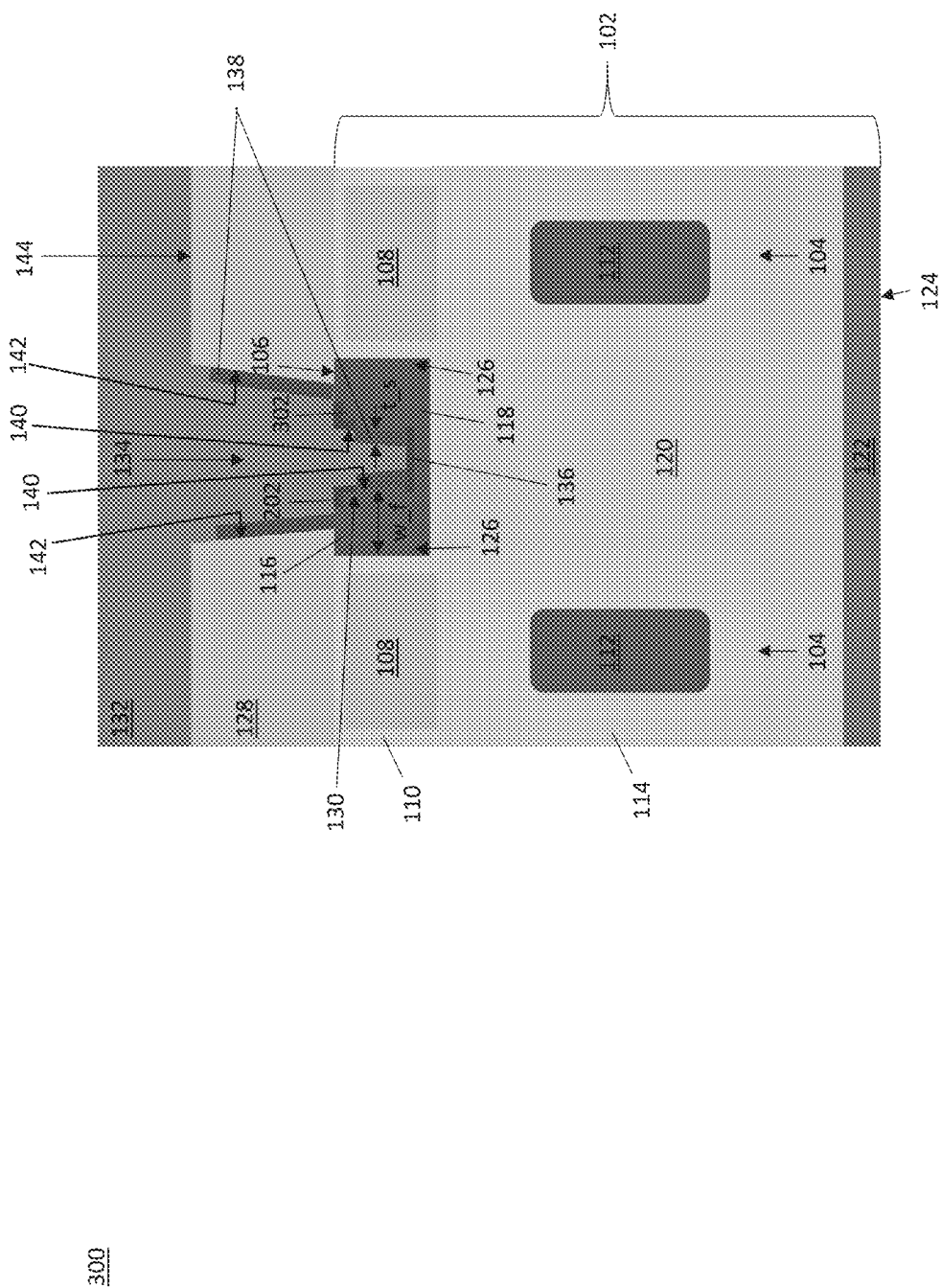

FIG. 3 illustrates a partial cross-sectional view of yet another embodiment of a semiconductor device 300 having body contacts with dielectric spacers. The embodiment shown in FIG. 3 is similar to the embodiment shown in FIG.

2. Different, however, a section 302 of the body region 118 extends to the front surface 106 of the semiconductor substrate 102 and each source/collector region 116 is disposed laterally between the adjacent gate trench 104 and the section 302 of the body region 118 that extends to the front surface 106 of the semiconductor substrate 102. The contact opening 130 is formed in the section 302 of the body region 118 that extends to the front surface 106 of the semiconductor substrate 102. The electrically insulative spacer 138 is recessed below the front surface 106 of the semiconductor substrate 102 along the sidewalls 140 of the section 302 of the body region 118 that extends to the front surface 106 of the semiconductor substrate 102, so that an upper part of the sidewalls 140 is devoid of the electrically insulative spacer 138.

Figure 4:
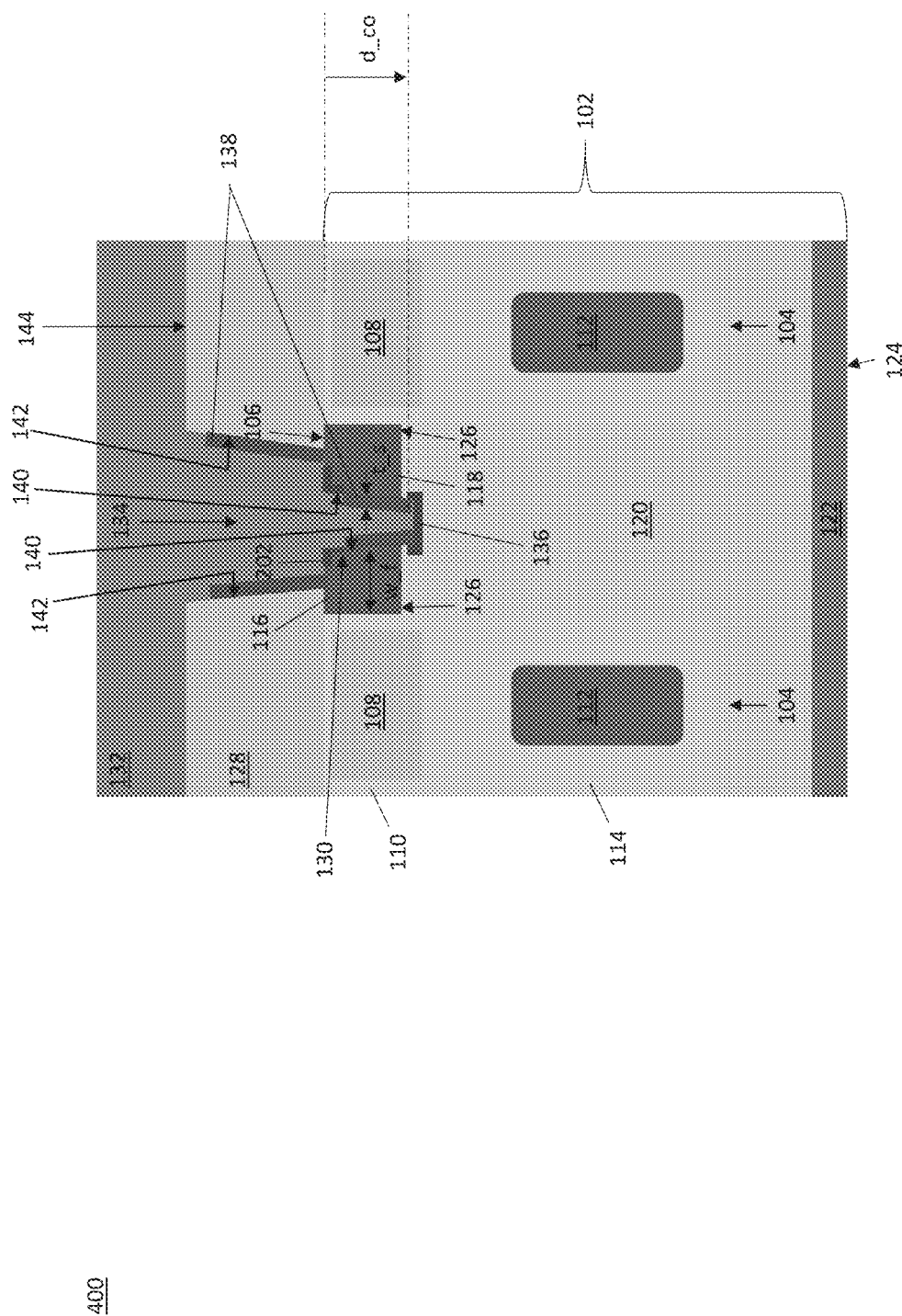

FIG. 4 illustrates a partial cross-sectional view of still another embodiment of a semiconductor device 400 having body contacts with dielectric spacers. The embodiment shown in FIG. 4 is similar to the embodiment shown in FIG. 3. Different, however, the contact opening 130 extends to a depth (d_co) in the semiconductor substrate 102 measured from the front surface 106 deeper than the body region 118 and into the underlying drift region 120 so that the body contact plug 134 extends into the drift region 120. According to this embodiment, the highly-doped body contact region 136 that adjoins the body contact plug 134 at the bottom of the contact opening 130 is formed in the drift region 118 and provides blocking capability of the resulting pn junction with the drift region 120. The upper highly-doped body contact region 202 provides a low-ohmic connection to the body contact plug 134 at the front surface 106 of the semiconductor substrate 102.

In some embodiments, the source/collector region 116 has a depth in a range between 10 nm to 50 nm, the body region 118 has a depth in a range between 100 nm and 200 nm, the interlayer dielectric 128 has a thickness in a range between 50 nm and 300 nm, the contact opening 130 in the interlayer dielectric 128 has a minimum width w1 in a range between 200 nm and 220 nm, the contact (groove) opening 130 in the semiconductor body 100 has a minimum width w2 in a range between 100 nm and 140 nm, the length of the channel regions 126 in the vertical direction is in a range between 50 nm and 200 nm, and/or the lateral channel length is less than 250 nm. Other depth, thickness, width and length ranges are contemplated.

FIGS. 5A through 5D illustrate an embodiment of some processing steps for manufacturing the semiconductor devices shown in FIGS. 1 through 4.

Figure 5A:
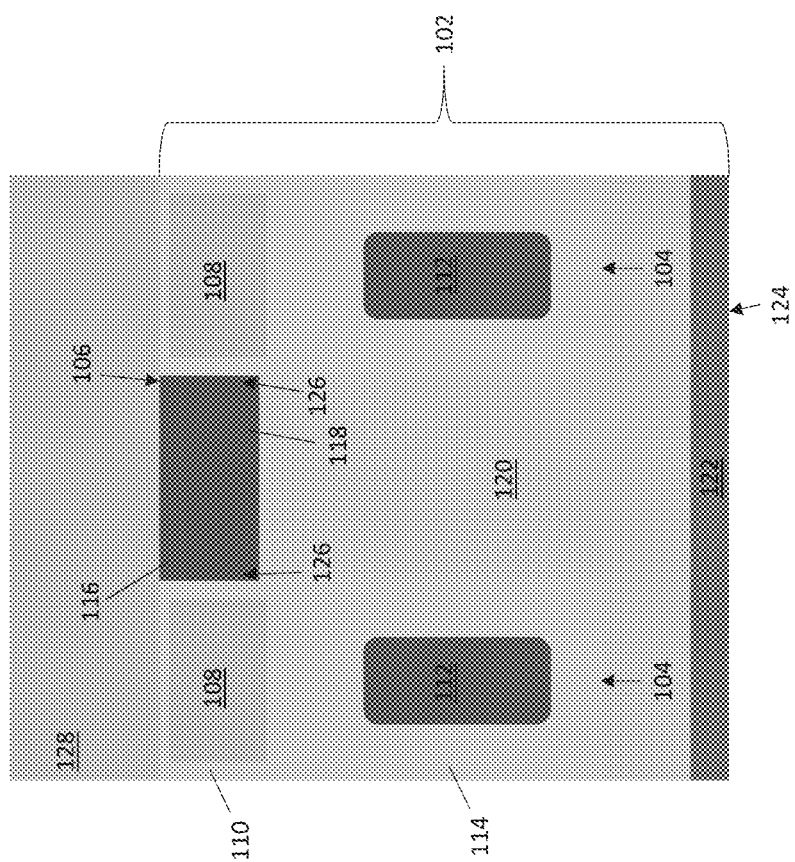
FIGS. 5A through 5D illustrate an embodiment of some processing steps for manufacturing the semiconductor devices shown in FIGS. 1 through 4.

FIG. 5A shows the interlayer dielectric 128 formed on the front surface 106 of the semiconductor substrate 102, after the gate trenches 104, source/collector region 116, body region 118, drift region 120, and drain/collector region 122 have been formed.

Figure 5B:
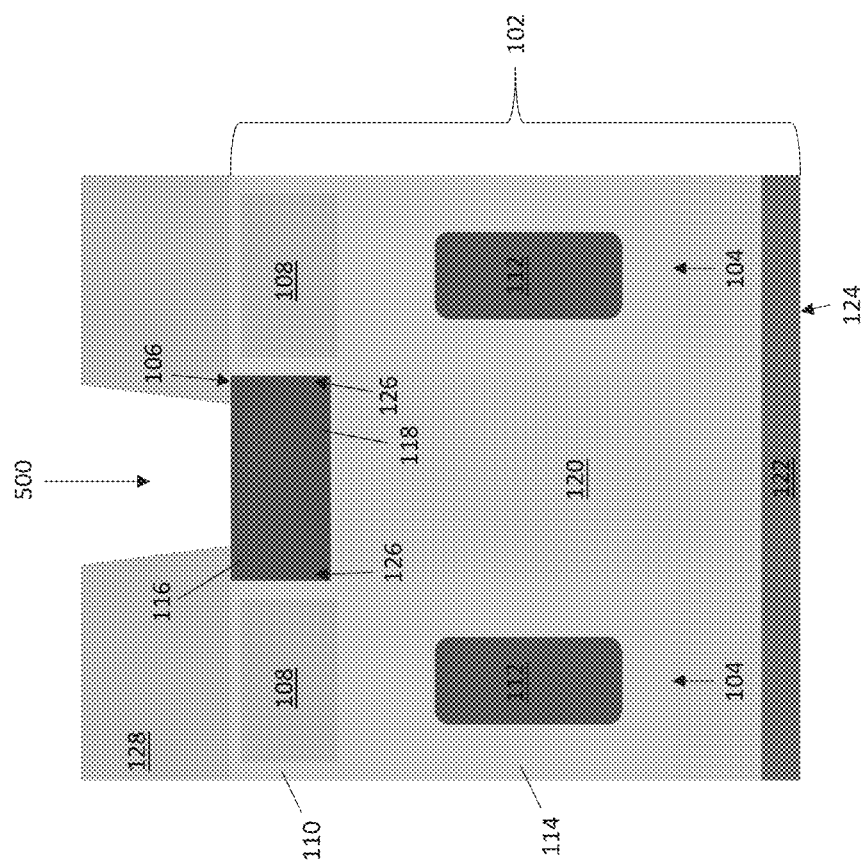

FIG. 5B shows an opening 500 formed in the interlayer dielectric 128. The opening 500 can be formed using a self-aligned process, using a lithography-aligned process, etc. The amount of overlay and critical dimension variation of the opening 130 define the width of the contact stripe to be formed.

Figure 5C:
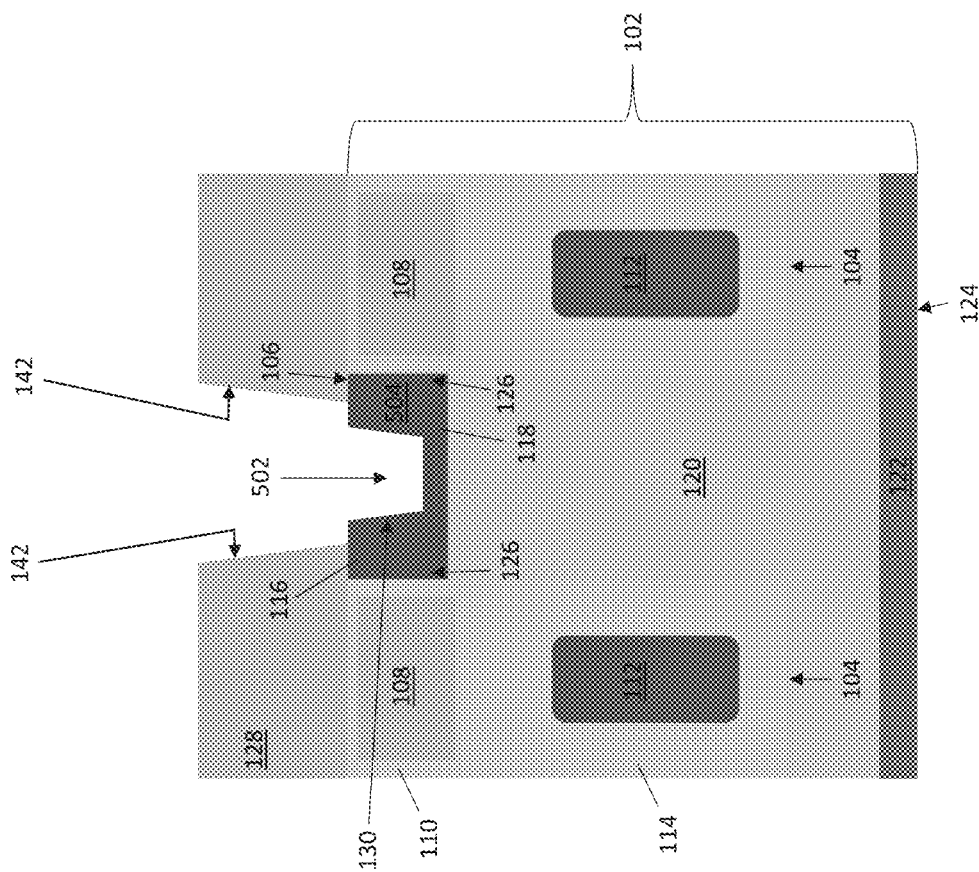

FIG. 5C shows a groove 502 that is aligned with the opening 500 in the interlayer dielectric 128 and etched into the semiconductor body 100. The groove 502 extends at least into the body region 118. The opening 500 in the interlayer dielectric 128 and the groove 502 etched into the semiconductor body 100 form the contact opening 130. The groove 502 can be etched completely through the body region 118 so that the contact opening 130 extends into the underlying drift region 120 e.g. as shown in FIG. 4. In either case, the sidewalls 142 of the interlayer dielectric 128 formed by the opening 130 are etched back to define the thickness (t_s) of the electrically insulative spacer 138 to be formed. In one embodiment, the thickness of the electrically insulative spacer 138 is in a range between 10 nm and 30 nm. In one embodiment, the width of the semiconductor fin or stripe 504 between each side of the contact opening 130 and the corresponding gate trench 104 is less than 100 nm e.g. between 80 nm and 100 nm.

Figure 5D:
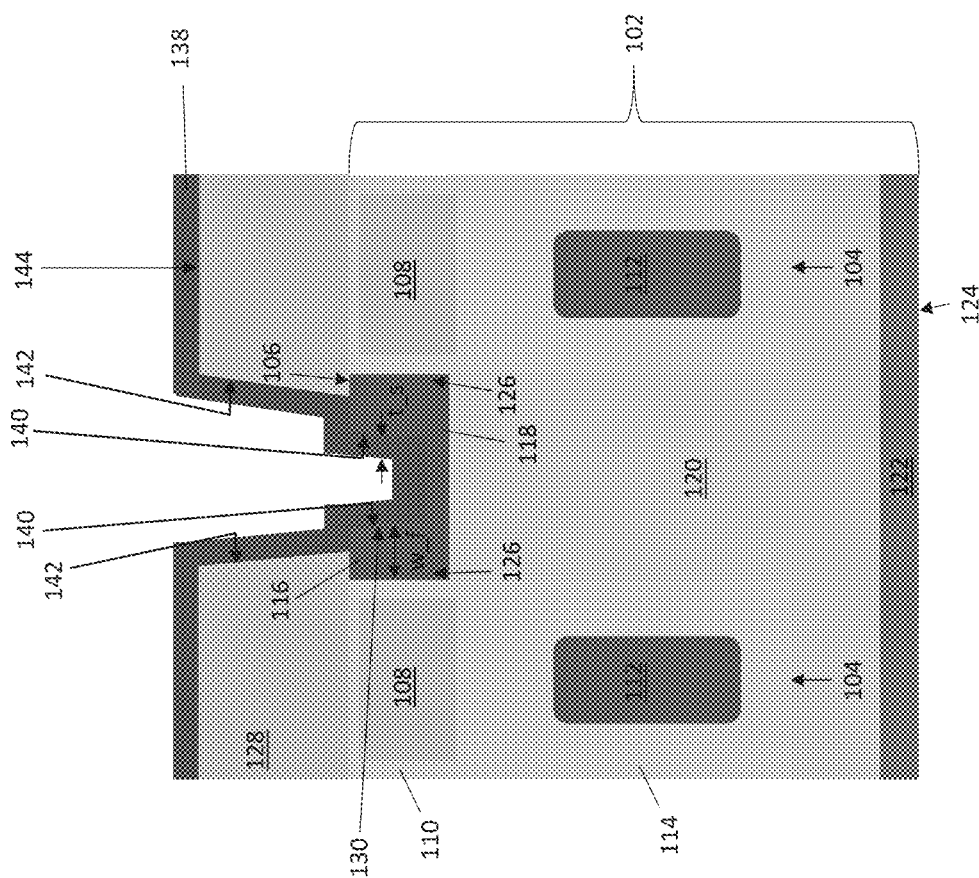

FIG. 5D shows the electrically insulative spacer 138 formed on the surface 144 of the interlayer dielectric 128 facing away from the semiconductor substrate 102, on the etched-back sidewalls 142 of the interlayer dielectric 128, on the front surface 106 of the source/emitter region 116, and on the sidewalls 140 of the groove 502 formed in the semiconductor substrate 102 that extends at least into the body region 118. Prior to deposition of the electrically conductive material 132 which fills the contact opening 130, the electrically insulative spacer 138 is removed from the bottom of the contact opening 130. The electrically insulative spacer 138 also can be removed from the front surface 106 of the source./emitter region 116 and along the upper part of the sidewalls 140 of the groove 502 formed in the semiconductor substrate 102 e.g. as shown in FIGS. 2 through 4.

FIG. 6 illustrates a partial top plan view of the semiconductor device embodiments shown in FIGS. 1 through 4. The top-half of FIG. 6 illustrates the upper features of the semiconductor device 100 shown in FIG. 1. The bottom-half of FIG. 6 illustrates the upper features of the semiconductor devices 200, 300, 400 shown in FIGS. 2 through 4. In each case, the gate trenches 104 (out of view in FIG. 6), source region 116, body region 118, and contact opening 130 are each stripe-shaped and extend in a longitudinal direction of the semiconductor substrate 102. The dashed line in FIG. 6 demarcates the top and bottom halves of the figure.

Figure 7:
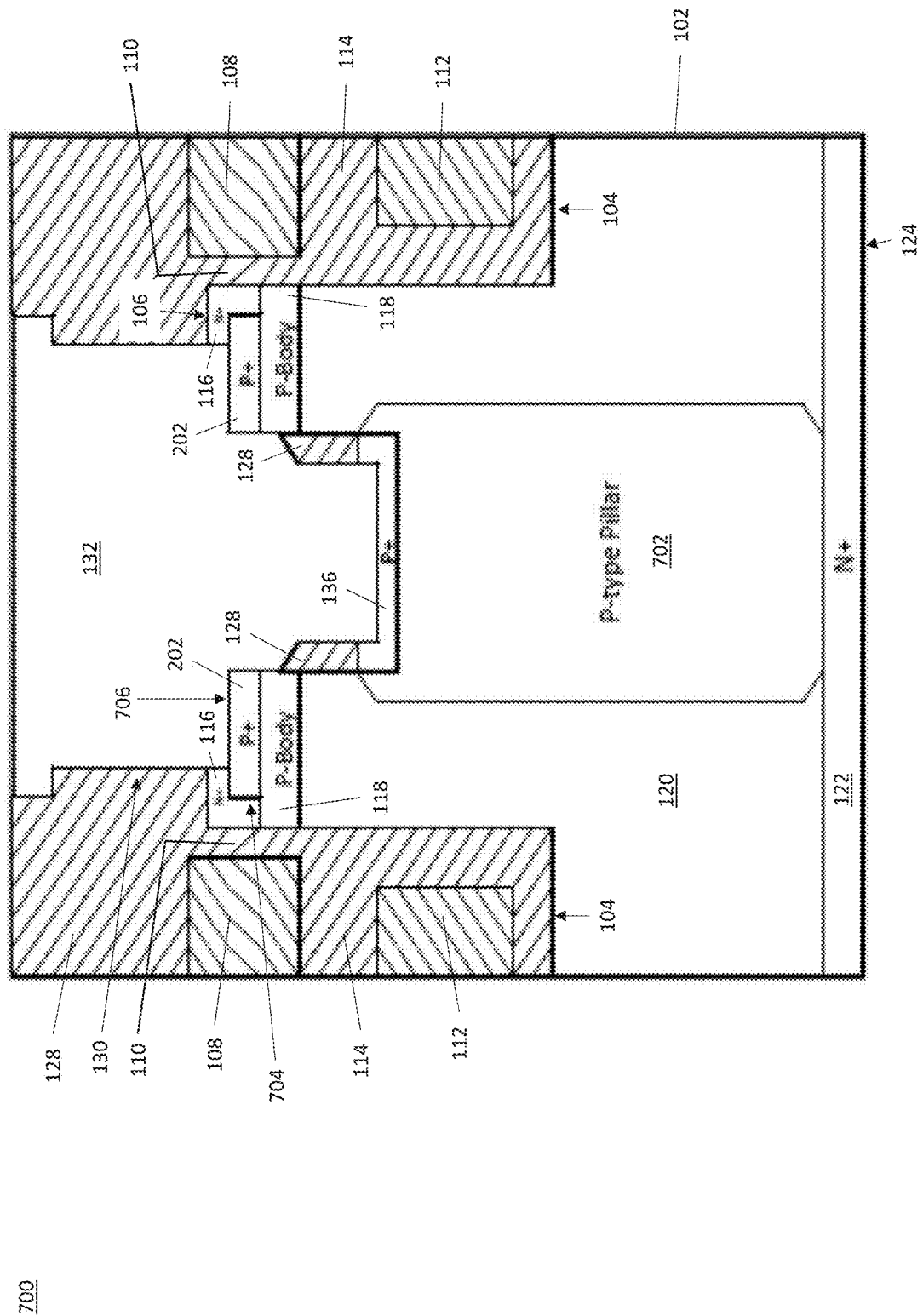
FIGS. 7 through 10 illustrate respective partial cross-sectional views of additional embodiments of semiconductor devices having body contacts with dielectric spacers.

FIG. 7 illustrates a partial cross-sectional view of an embodiment of a semiconductor device 700 having body contacts with dielectric spacers. The embodiment shown in FIG. 7 is similar to the embodiment shown in FIG. 4. Different, however, a pillar/column/stripe region 702 of the second conductivity type is formed in the drift region 120 and adjoins the highly-doped body contact region 136 below the bottom of the contact opening 130. The pillar/column/stripe region 702 of the second conductivity type extends to a greater depth in the semiconductor substrate 102 as measured from the front surface 106 than the gate trenches 104 and the highly-doped body contact region 136. In one embodiment, the pillar/column/stripe region 702 of the second conductivity type extends to and adjoins the drain/collector region 122 at the bottom surface 124 of the semiconductor substrate 102.

Further according to the embodiment illustrated in FIG. 7, an additional highly-doped body contact region 202 of the second conductivity type is formed on a section of the body region 118 adjacent the contact opening 130. The additional body contact region 202 is doped more heavily than the body region 118. The source/emitter region 116 adjoins a side surface 704 of the additional body contact region 202 facing the neighbouring gate trench 104, and extends onto the front surface 706 of the additional body contact region 202. The electrically conductive material filling the contact opening also adjoins the front surface of the additional body contact region.

Figure 8:
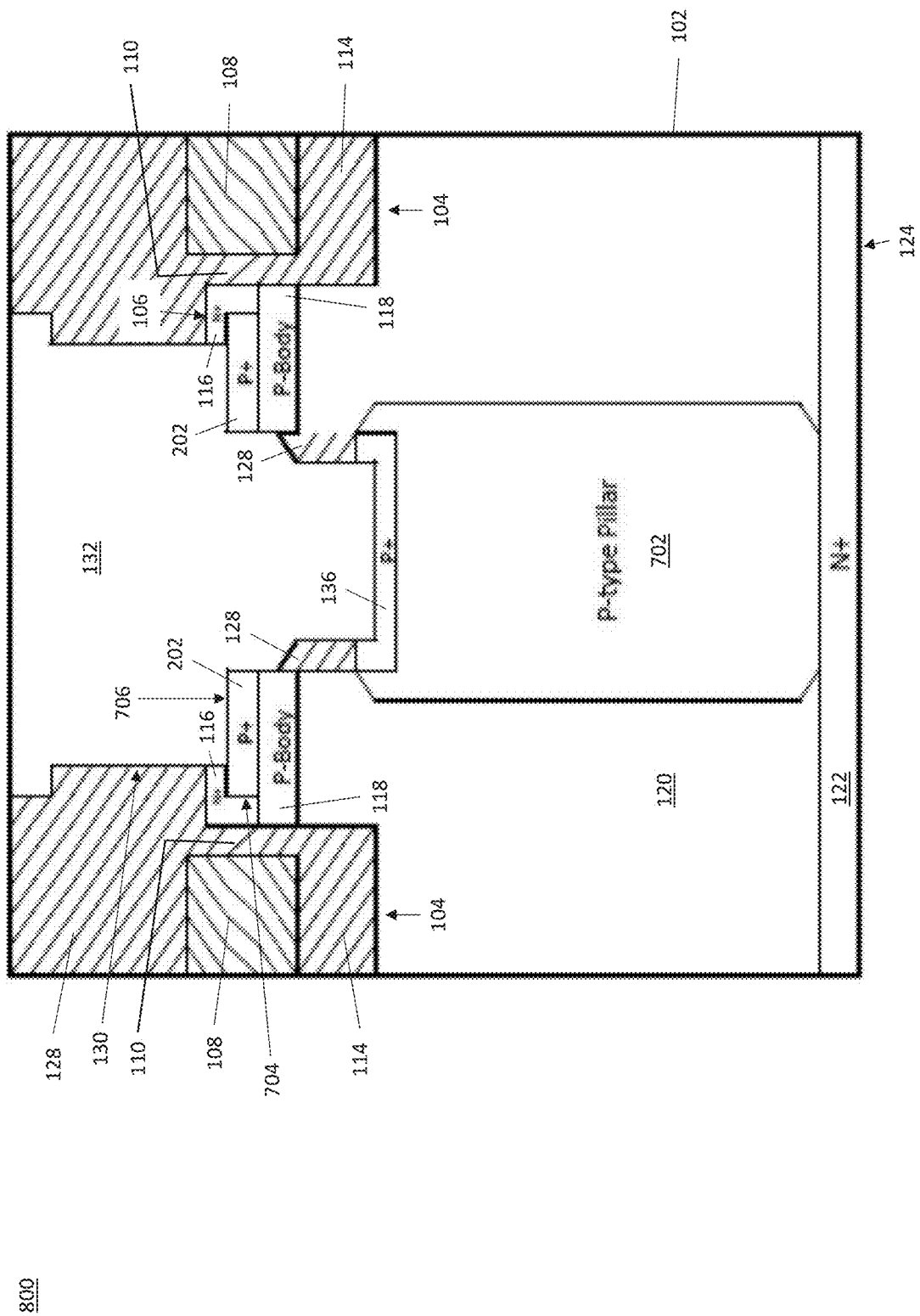

FIG. 8 illustrates a partial cross-sectional view of another embodiment of a semiconductor device 800 having body contacts with dielectric spacers, The embodiment shown in FIG. 8 is similar to the embodiment shown in FIG. 7. Different, however, the gate trenches 104 do not include field plates.

Figure 9:
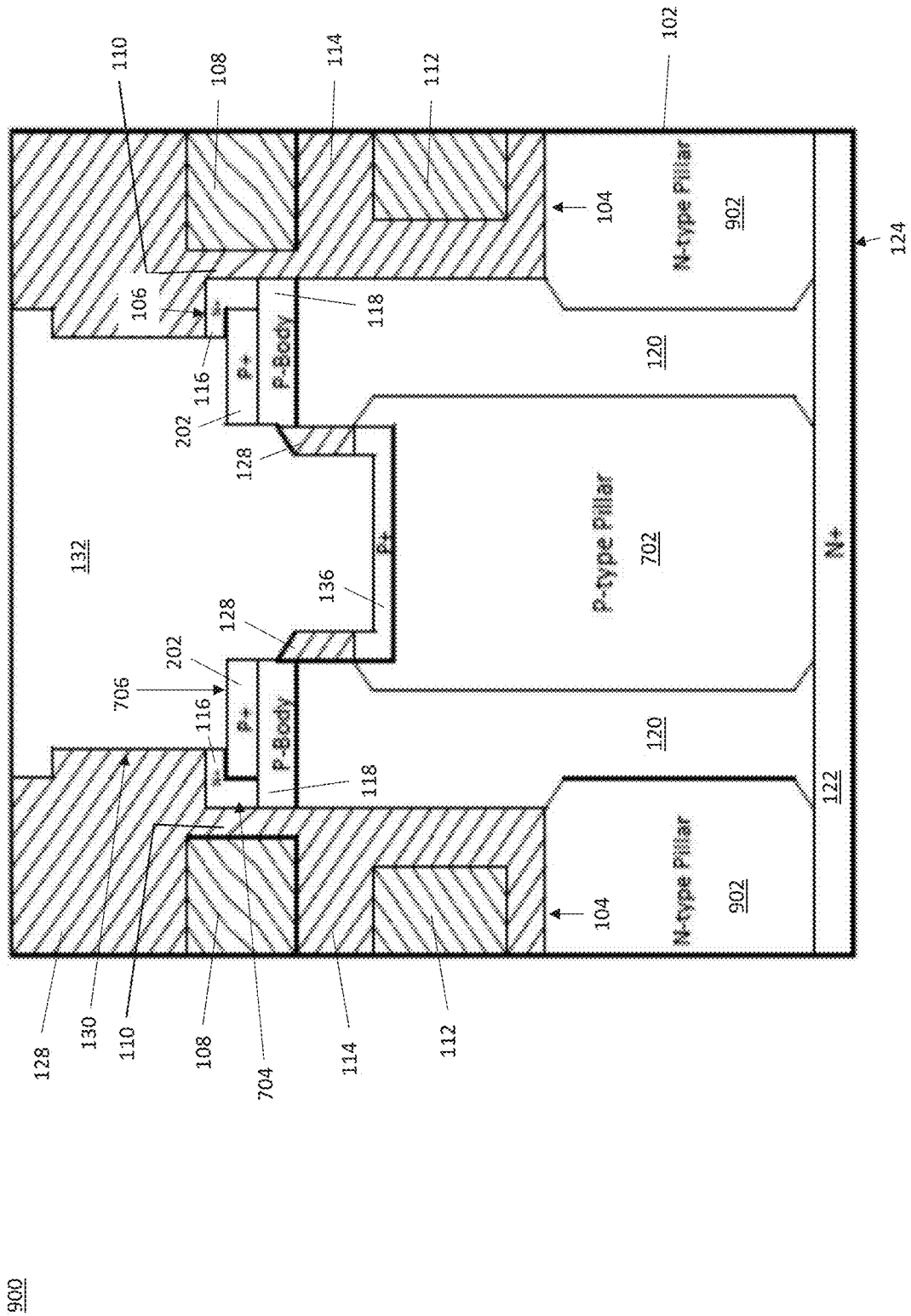

FIG. 9 illustrates a partial cross-sectional view of yet another embodiment of a semiconductor device 900 having body contacts with dielectric spacers. The embodiment shown in FIG. 9 is similar to the embodiment shown in FIG. 7, Different, however, a pillar/column/stripe region 902 of the first conductivity type is formed in the drift region 120 under each gate trench 104. The pillar/column/stripe region 902 of the first conductivity type is laterally separated from the pillar/column/stripe region 702 of the second conductivity type by a section of the drift region 120. The pillar/column/stripe region 902 of the first conductivity type extends to and adjoins the drain/collector region 122 at the back surface 124 of the semiconductor substrate 102, The drain/collector region 122 is doped more heavily than the pillar/column/stripe region 902 of the first conductivity type.

Figure 10:
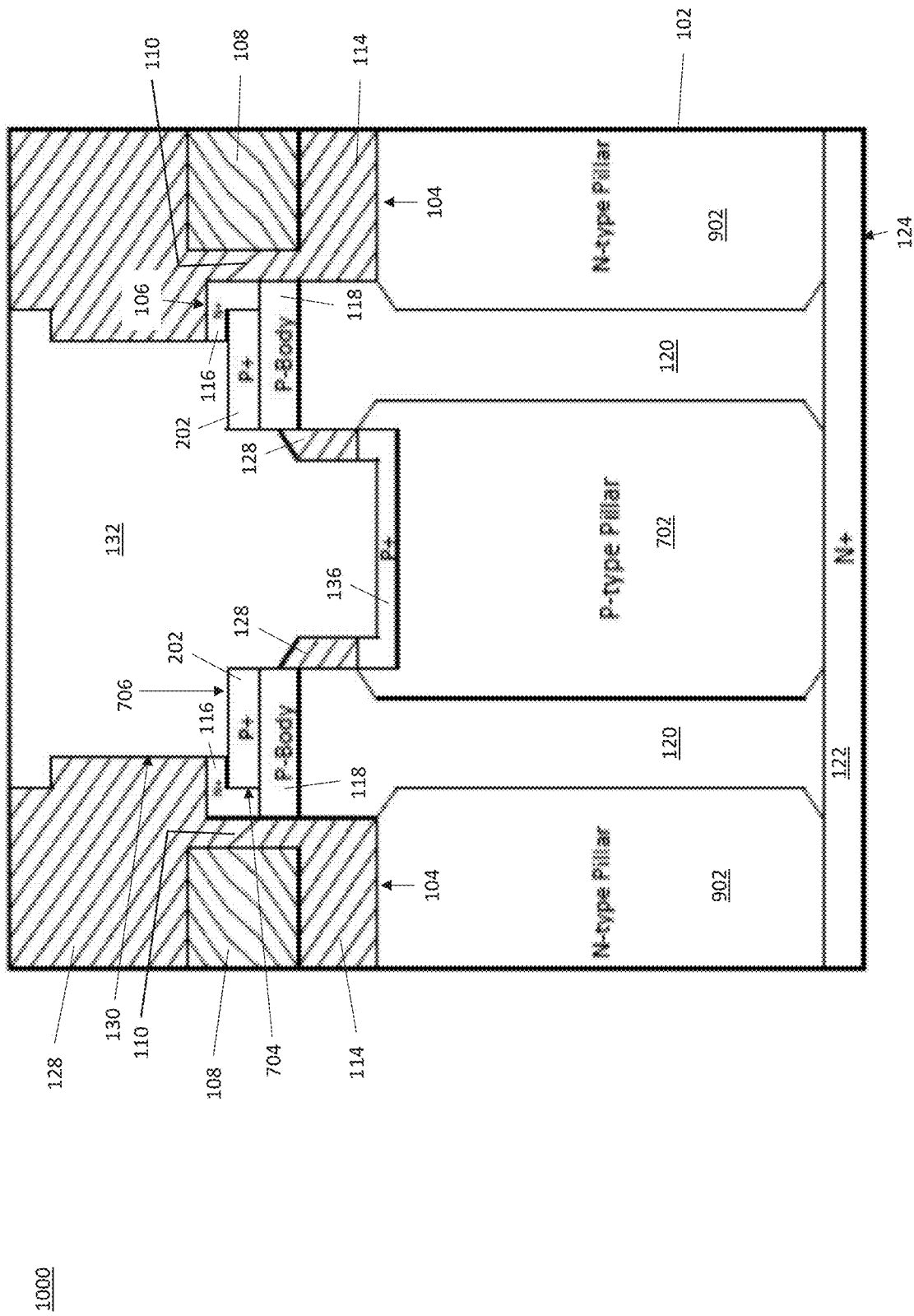

FIG. 10 illustrates a partial cross-sectional view of still another embodiment of a semiconductor device 1000 having body contacts with dielectric spacers. The embodiment shown in FIG. 10 is similar to the embodiment shown in FIG. 8. Different, however, a pillar/column/stripe region 902 of the first conductivity type is formed in the drift region 120 under each gate trench 104. The pillar/column/stripe region 902 of the first conductivity type is laterally separated from the pillar/column/stripe region 702 of the second conductivity type by a section of the drift region 120. The pillar/column/stripe region 902 of the first conductivity type extends to and adjoins the drain/collector region 122 at the back surface 124 of the semiconductor substrate 102. The drain/collector region 122 is doped more heavily than the pillar/column/stripe region 902 of the first conductivity type.

The semiconductor devices 700, 800, 900, 1000 illustrated in FIGS. 7 through 10 are shown as an n-channel devices, but the conductivity types of the device regions can be reversed to instead realize p-channel devices.

Figure 11A:
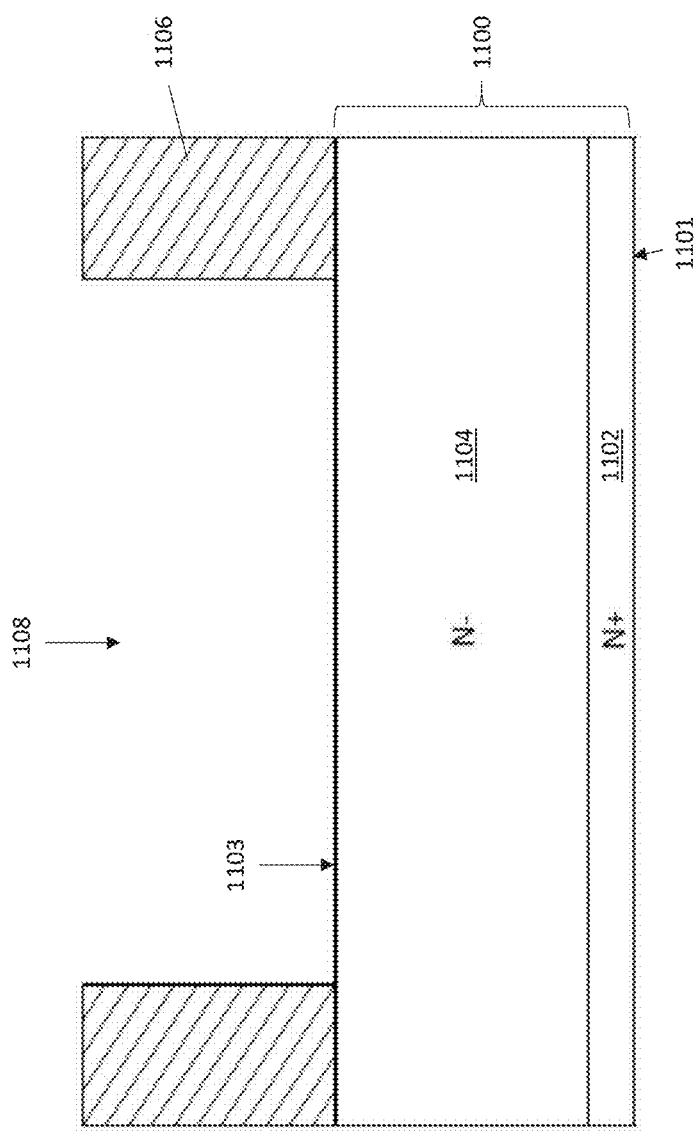
FIGS. 11A through 11Q illustrate an embodiment of a method of manufacturing the semiconductor device shown in FIG. 10.
Figure 11B:
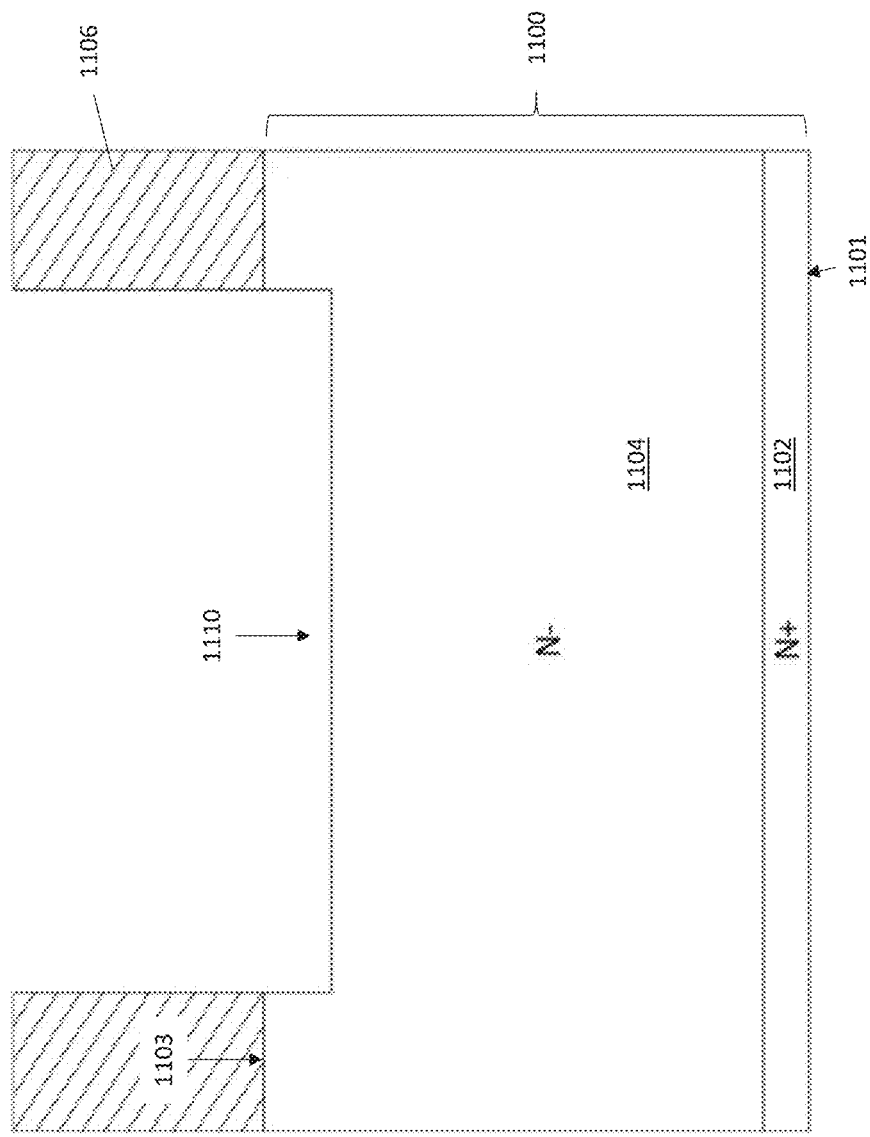
Figure 11C:
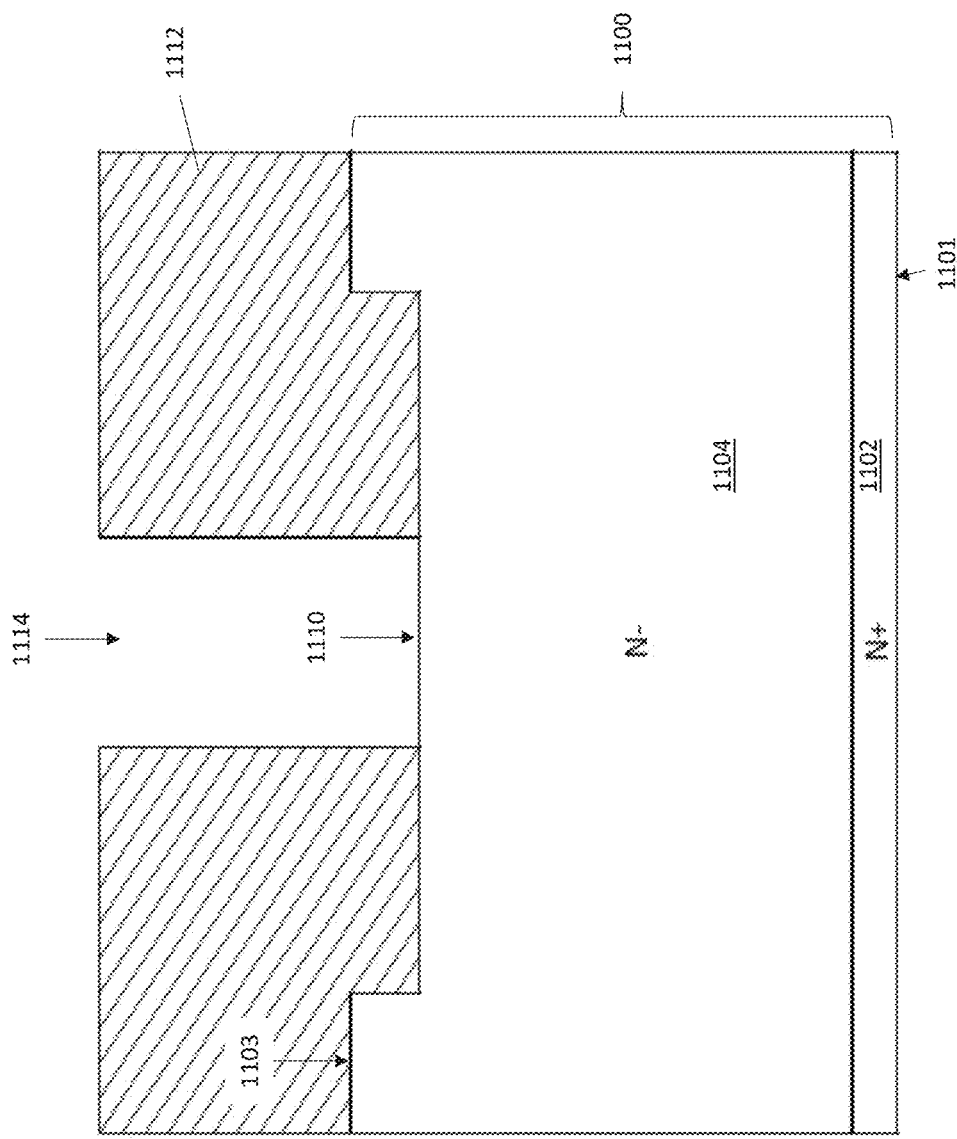
Figure 11D:
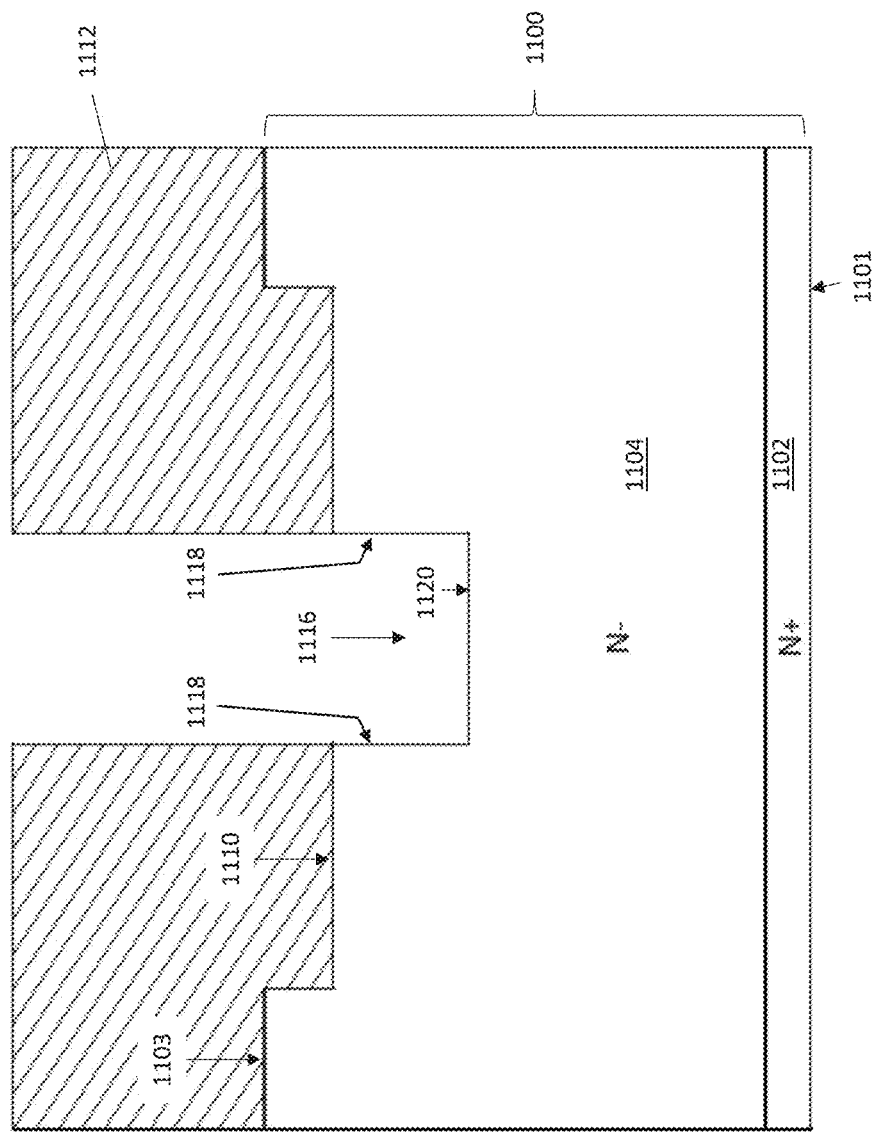
Figure 11E:
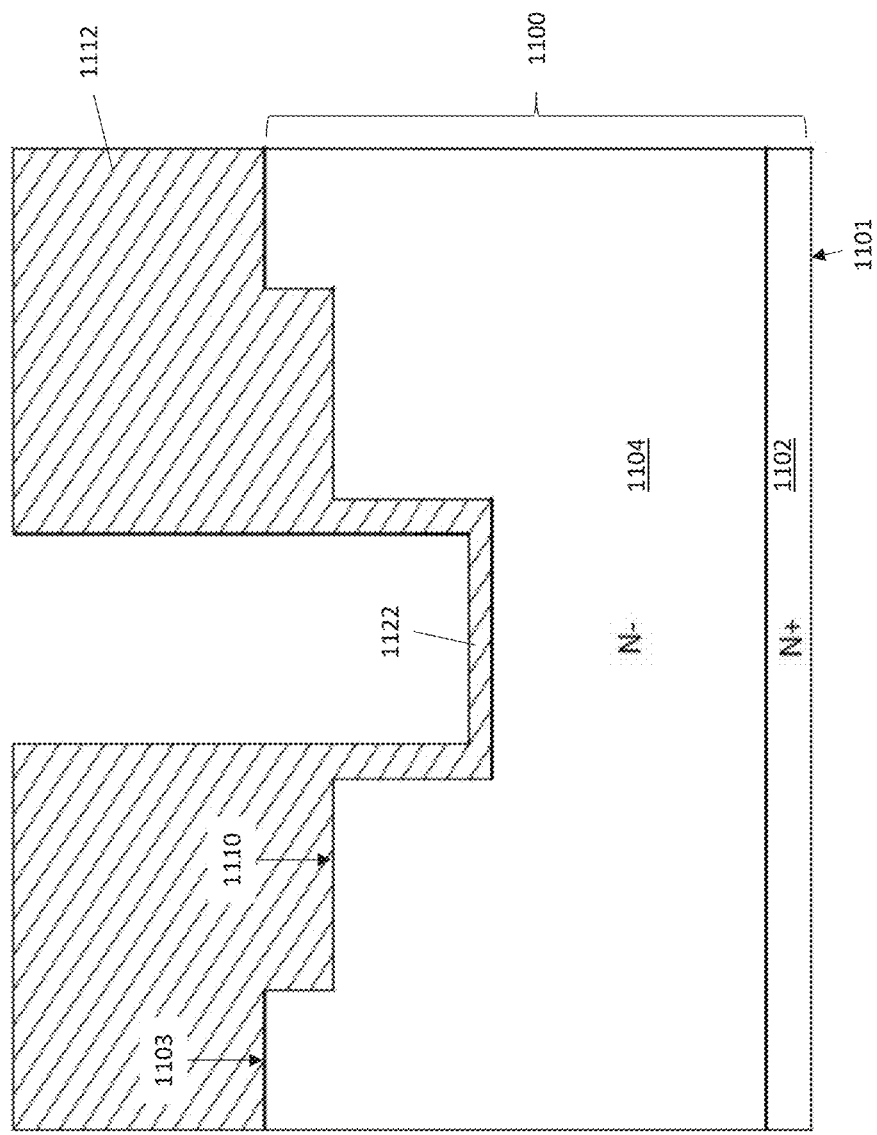
Figure 11F:
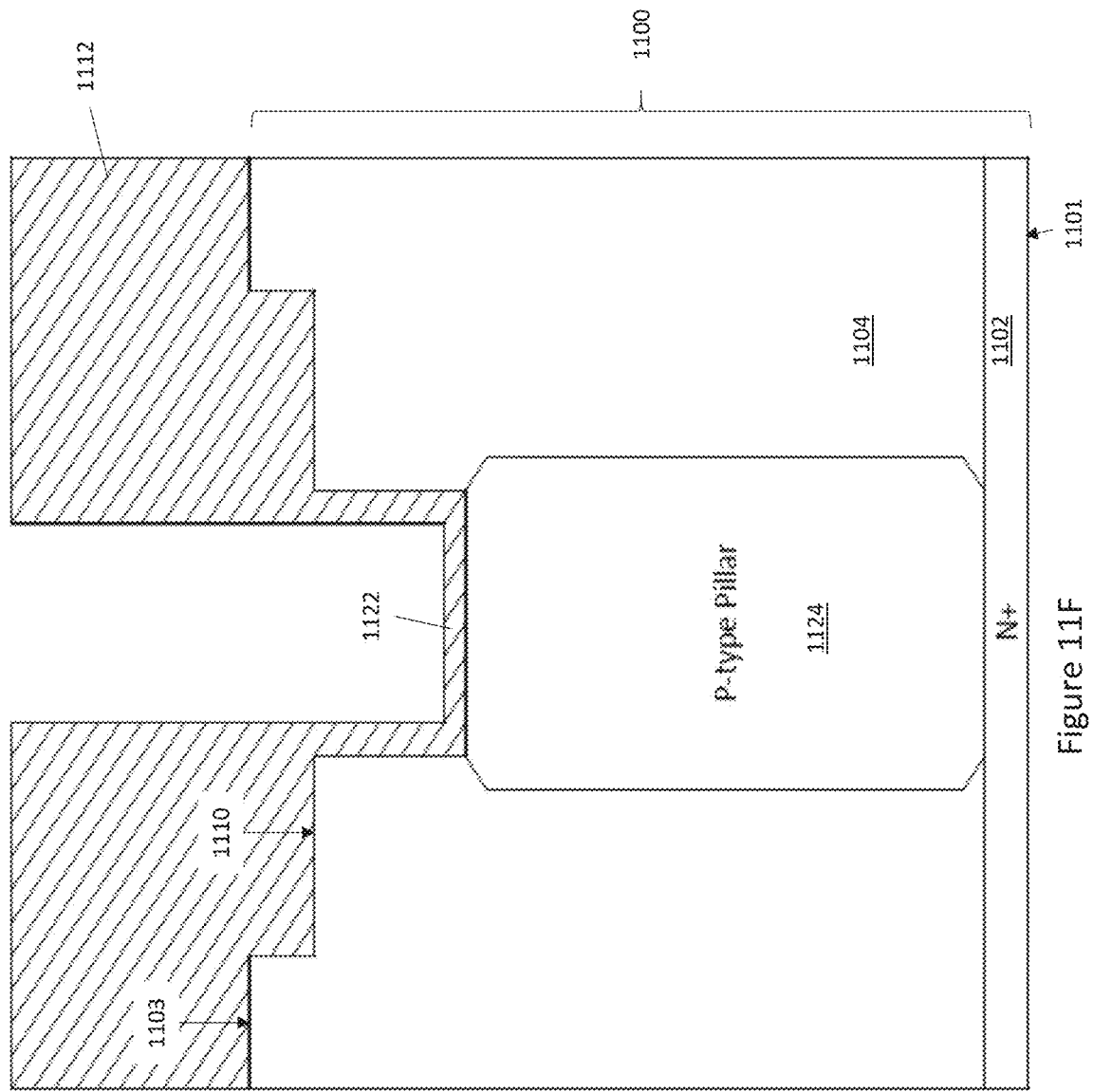
Figure 11G:
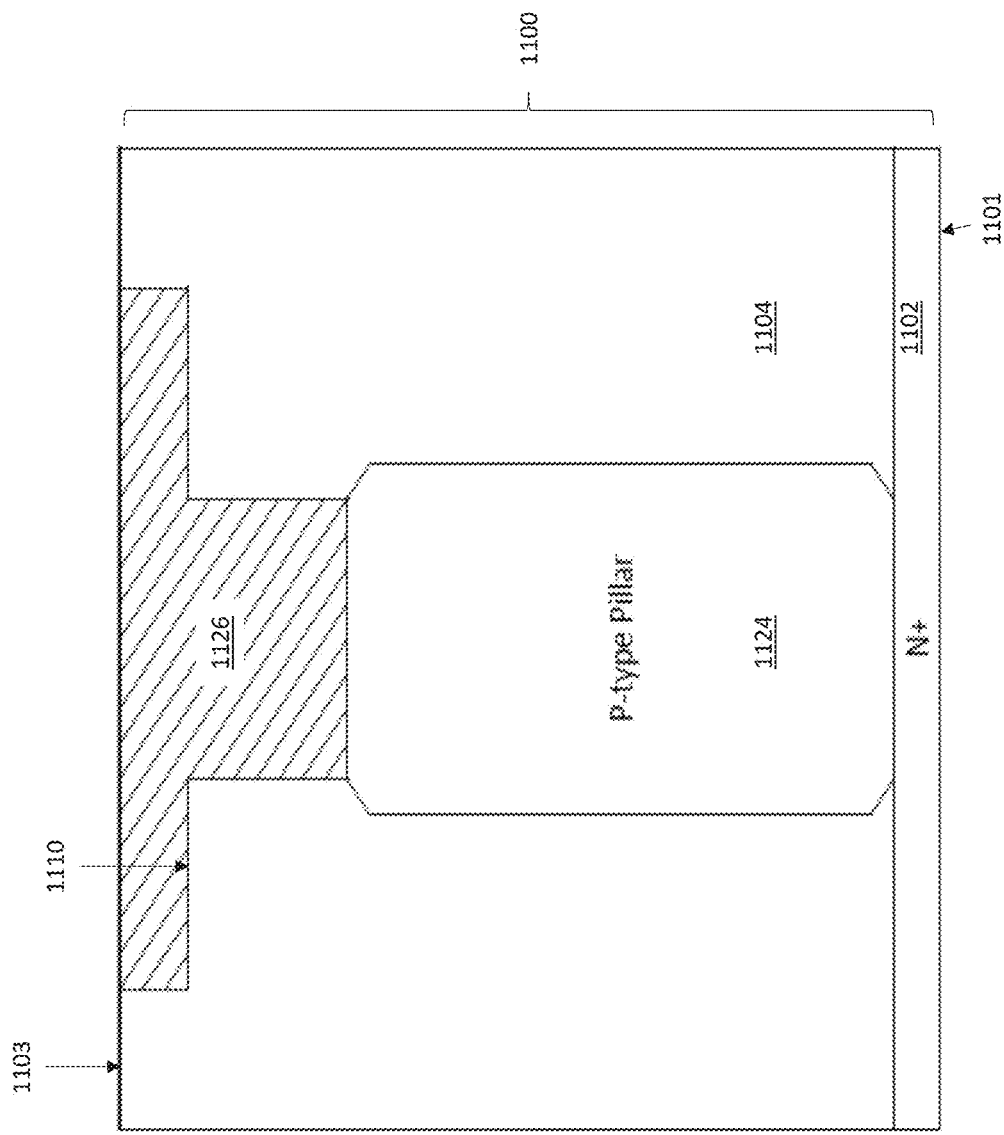
Figure 11H:
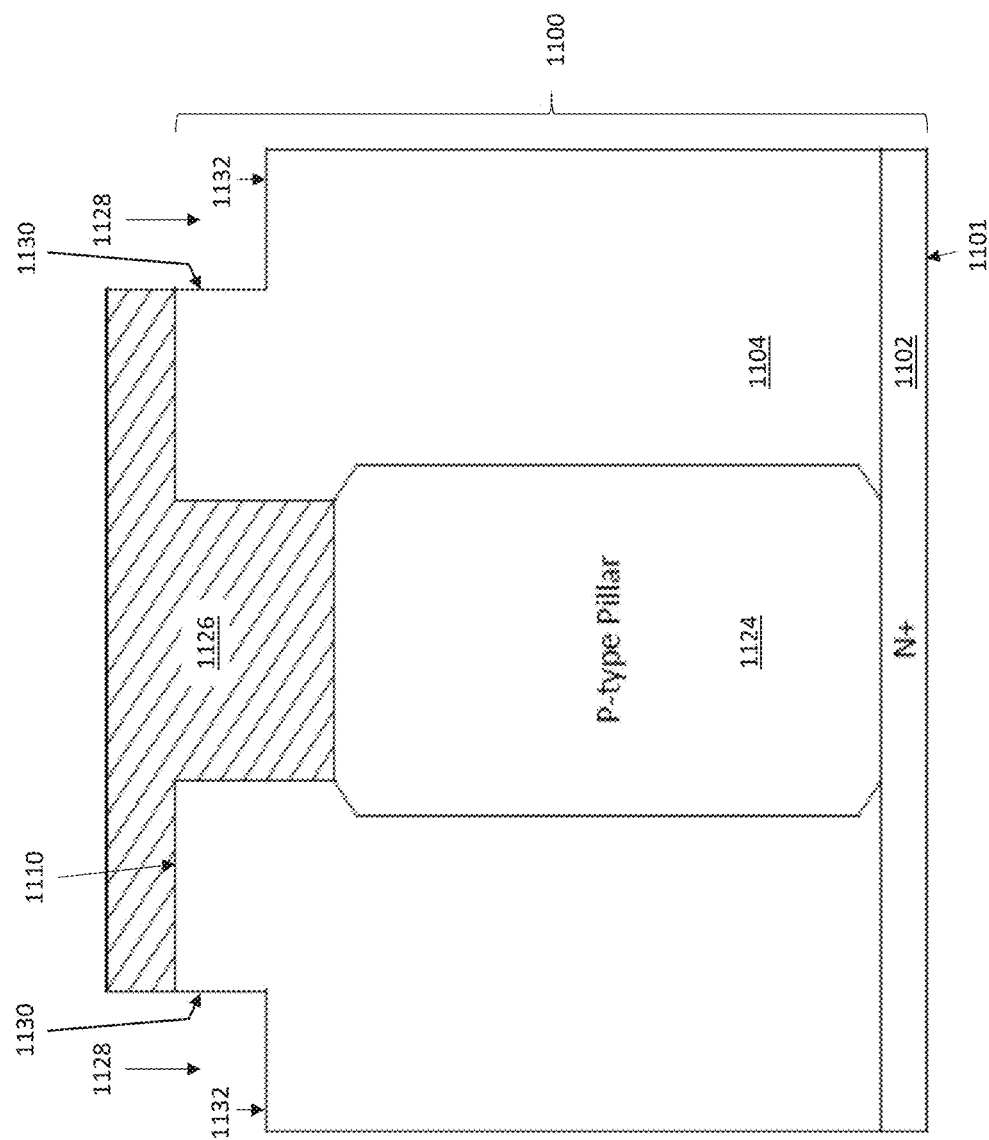
Figure 11I:
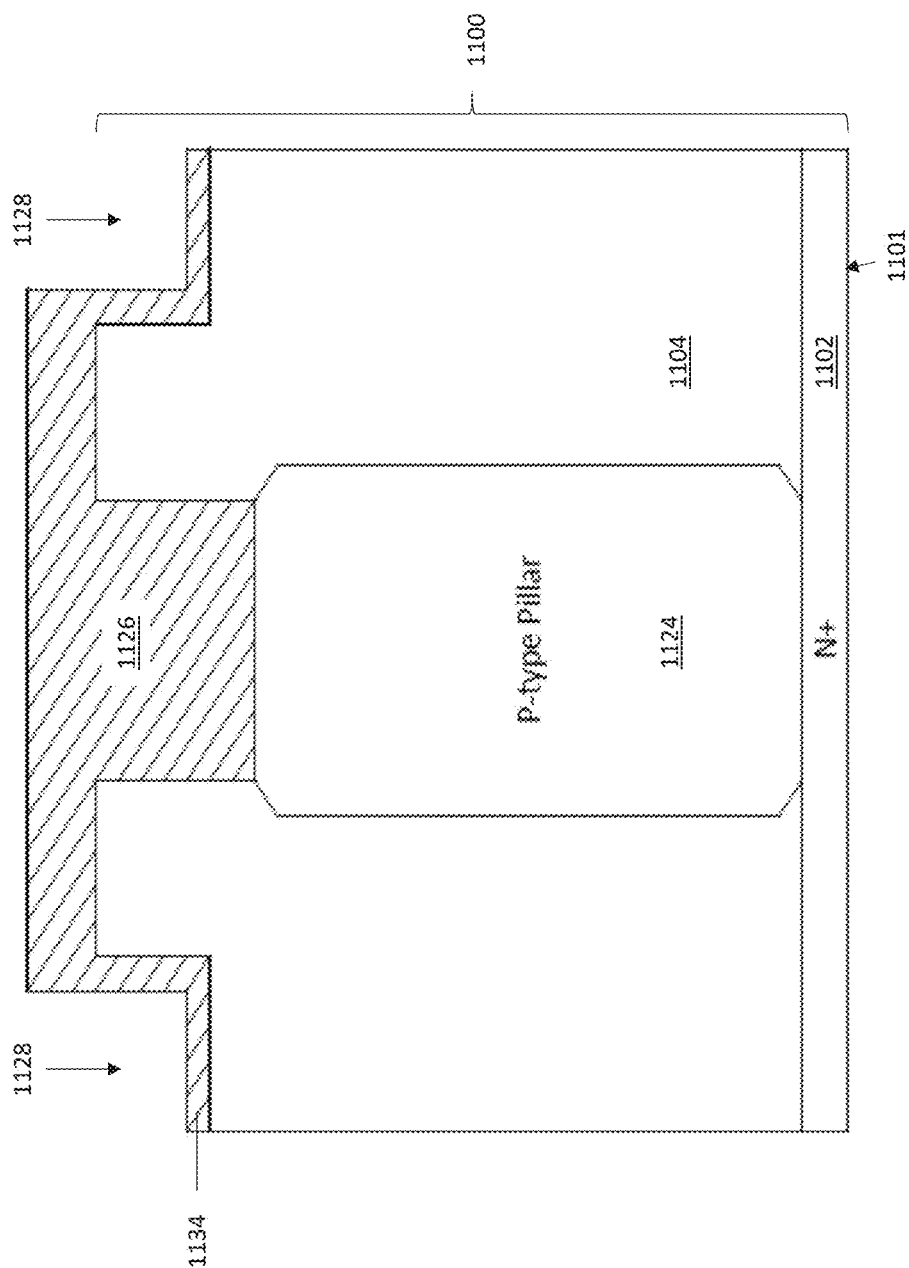
Figure 11J:
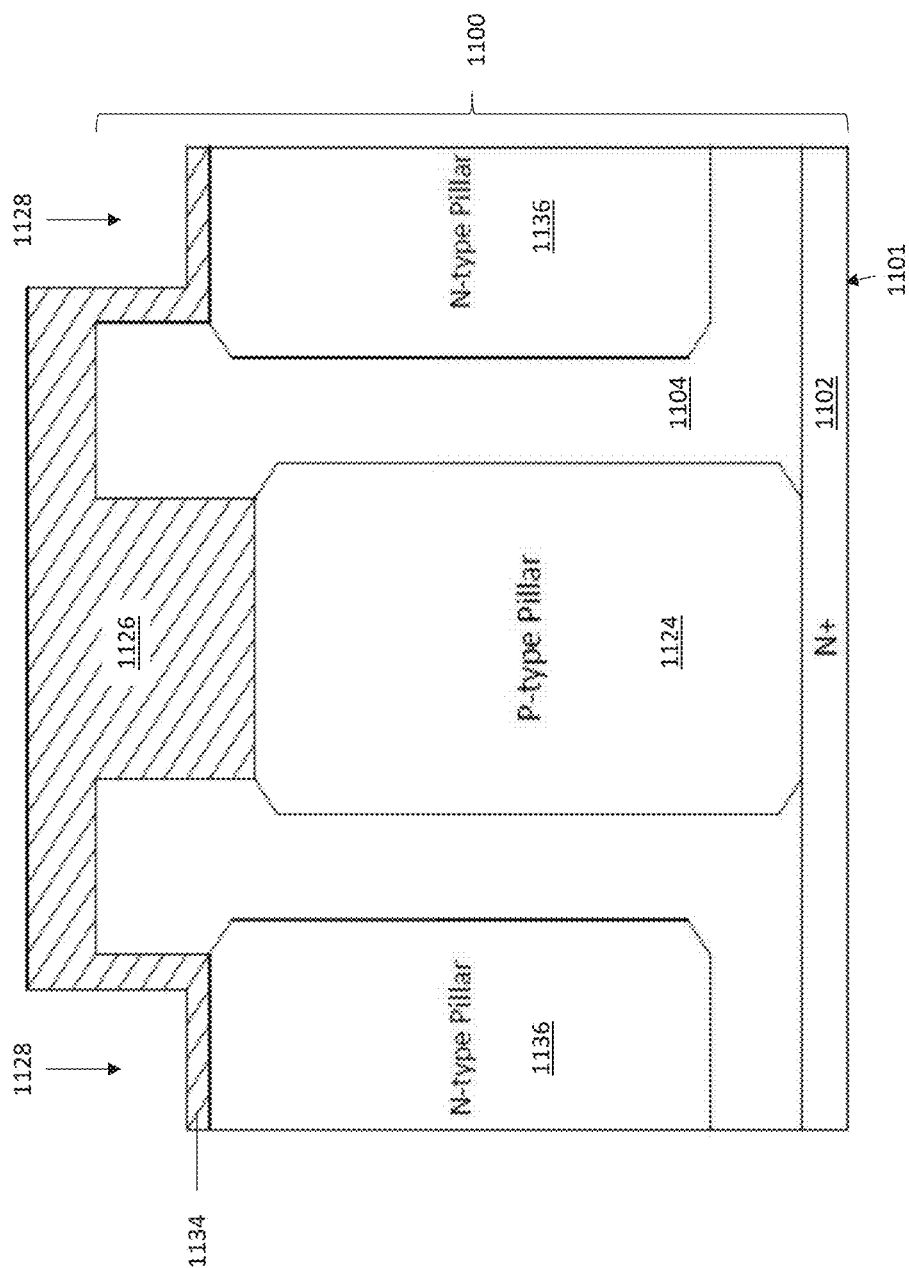
Figure 11K:
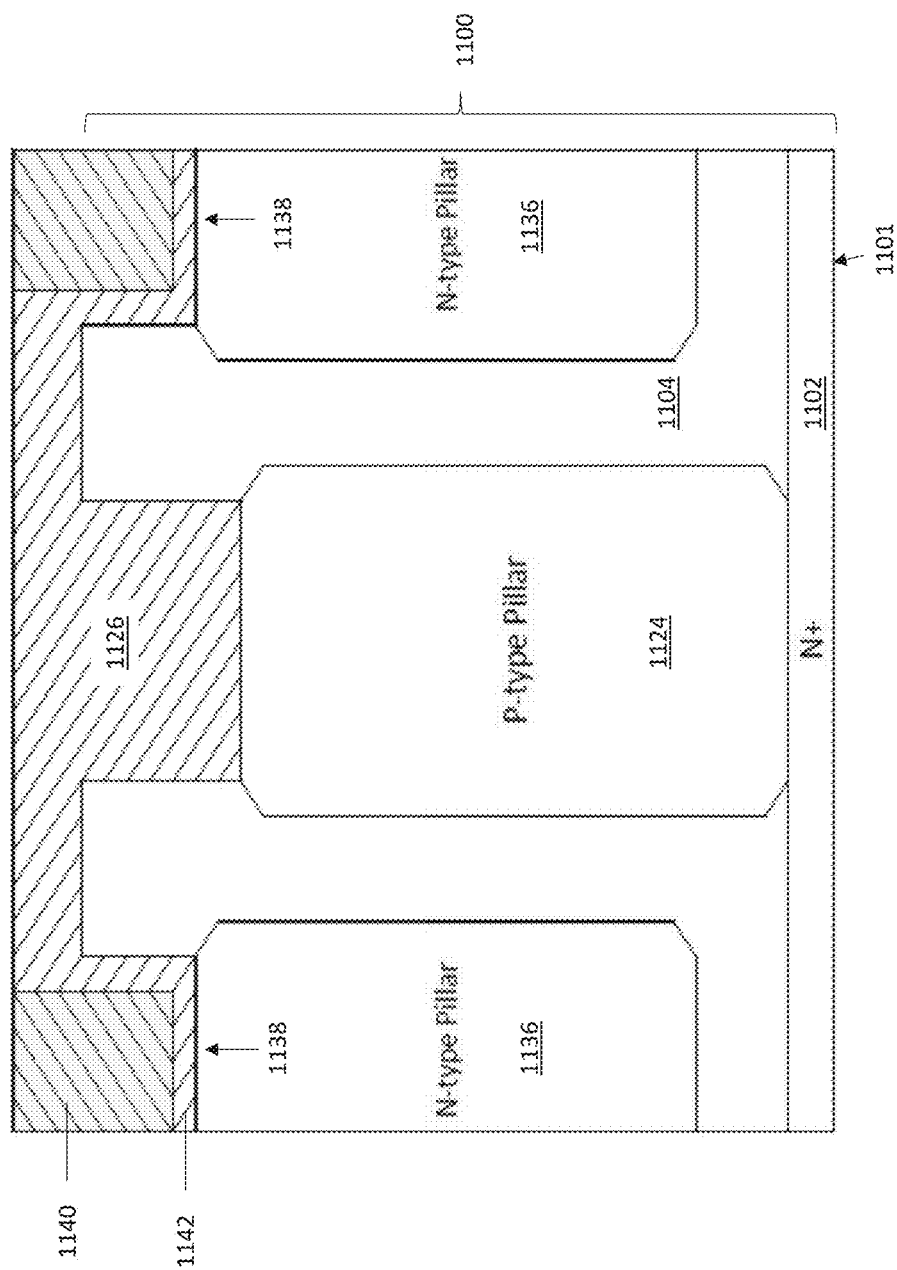
Figure 11L:
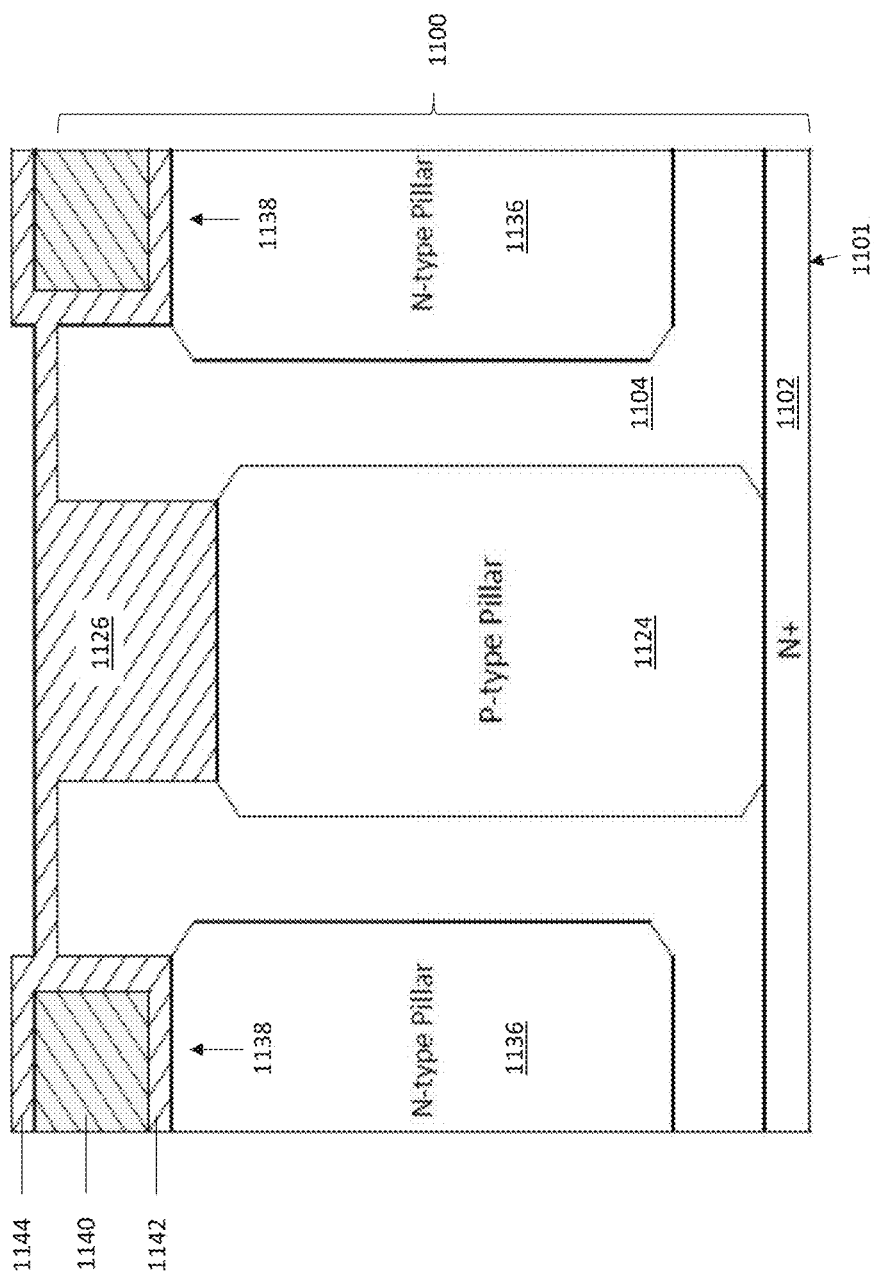
Figure 11M:
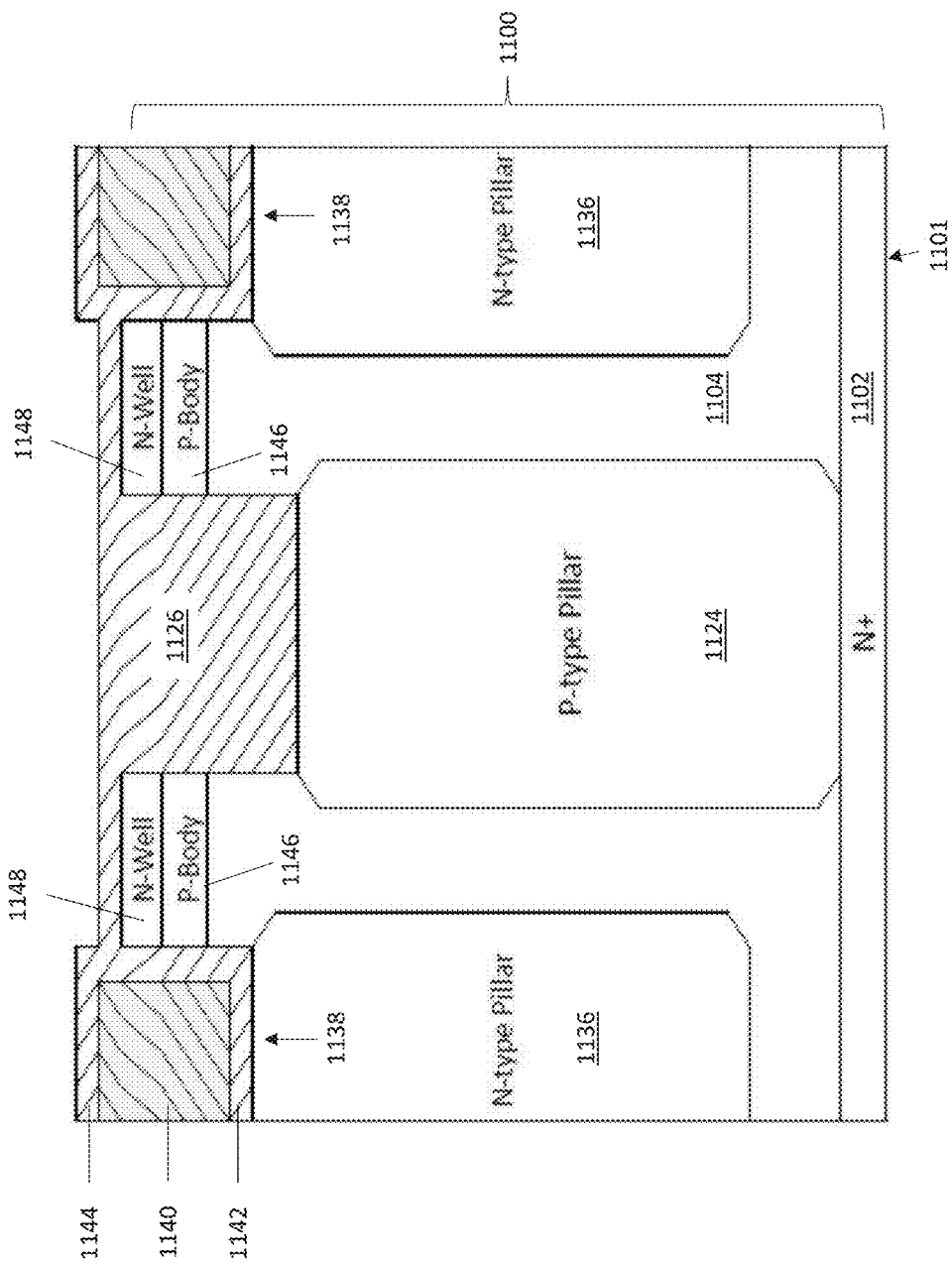
Figure 11N:
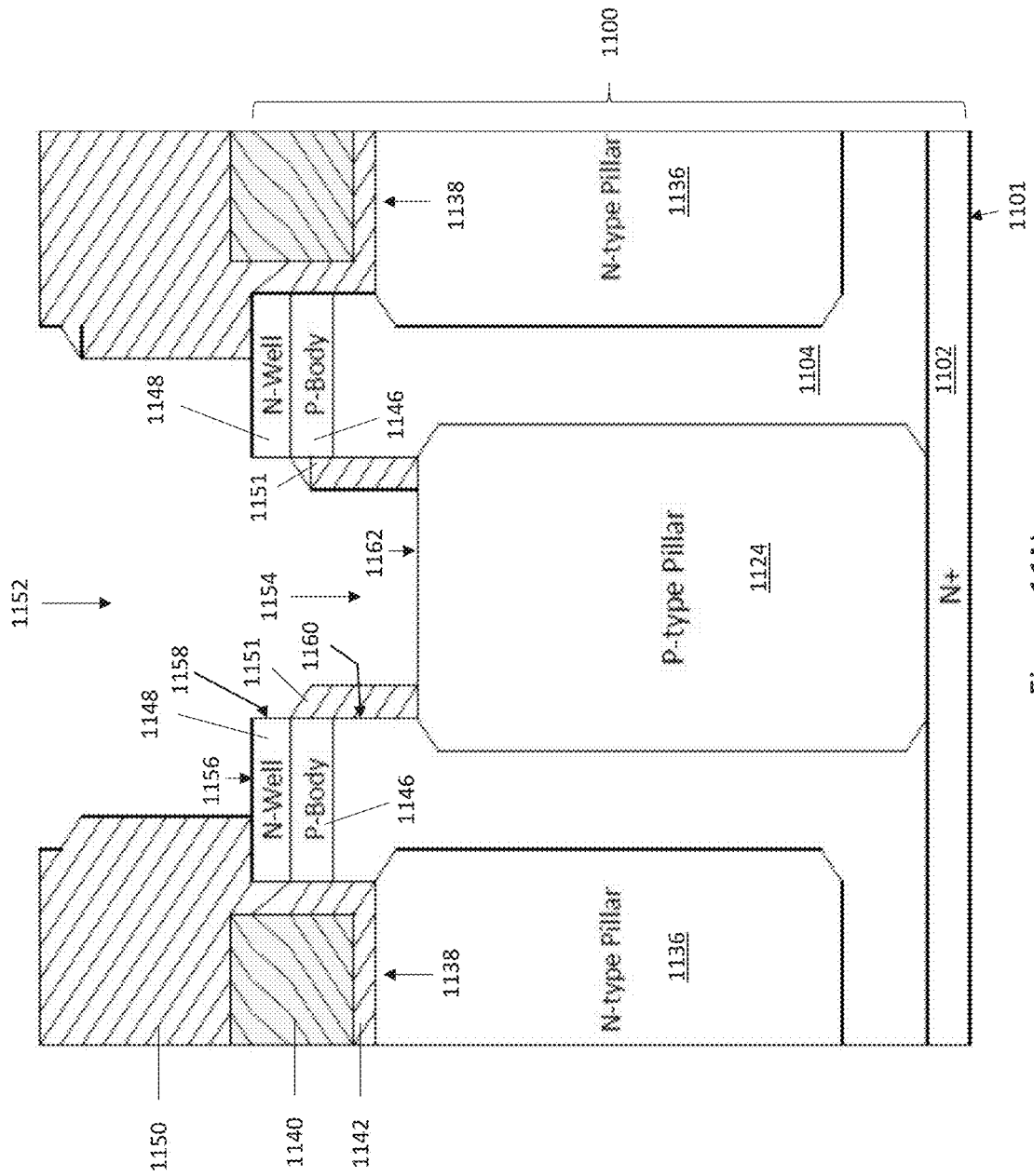
Figure 11O:
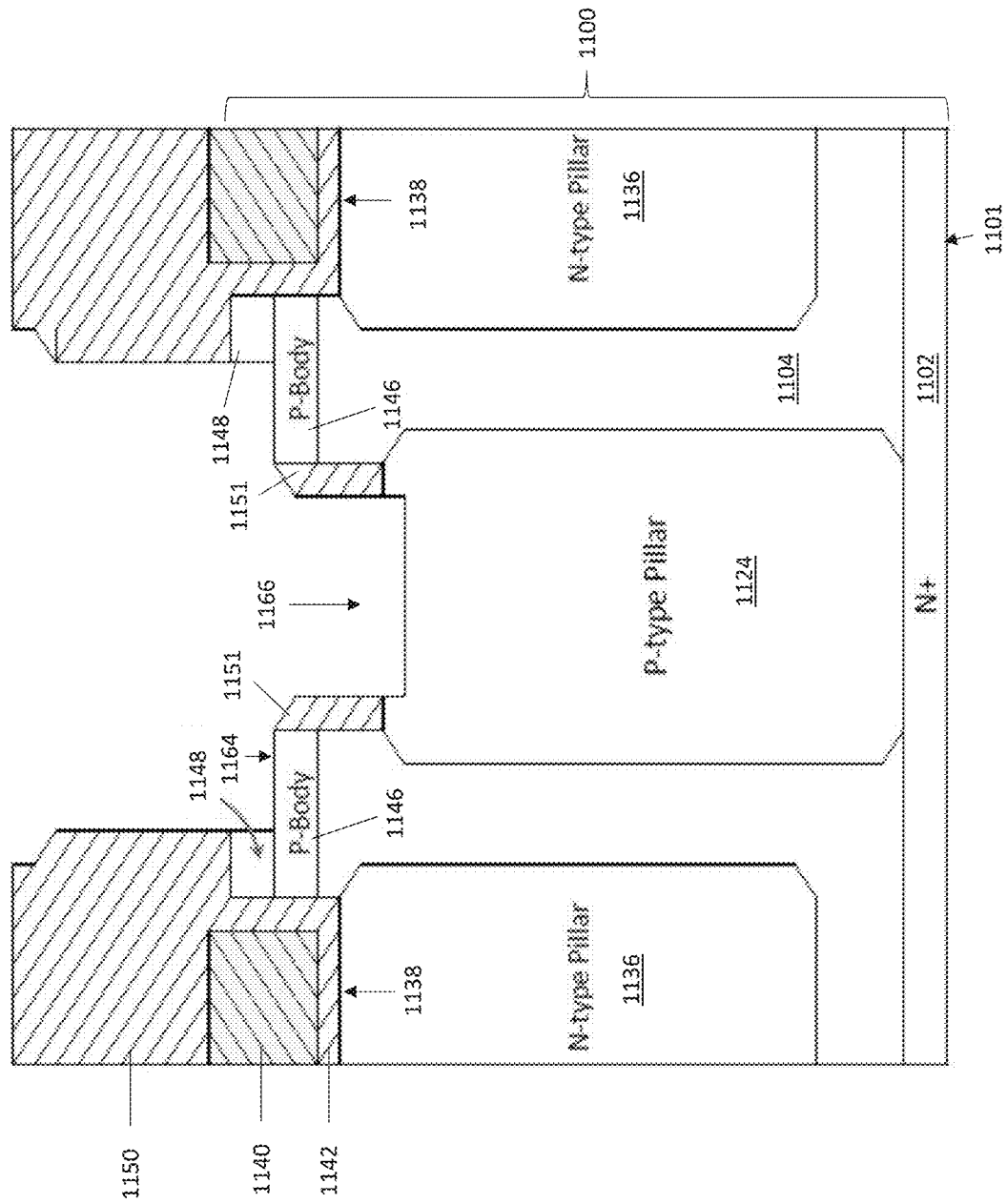
Figure 11P:
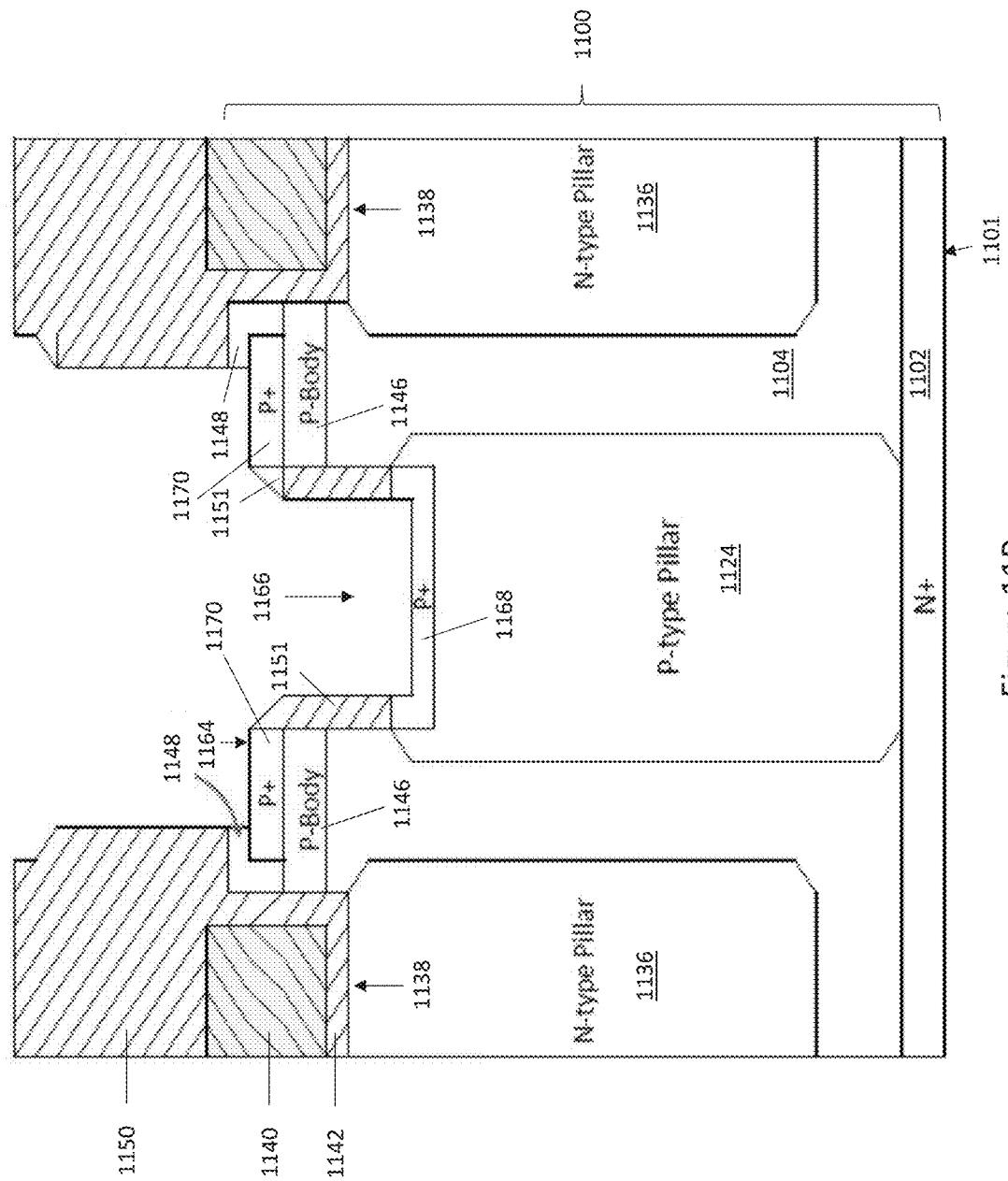
Figure 11Q:
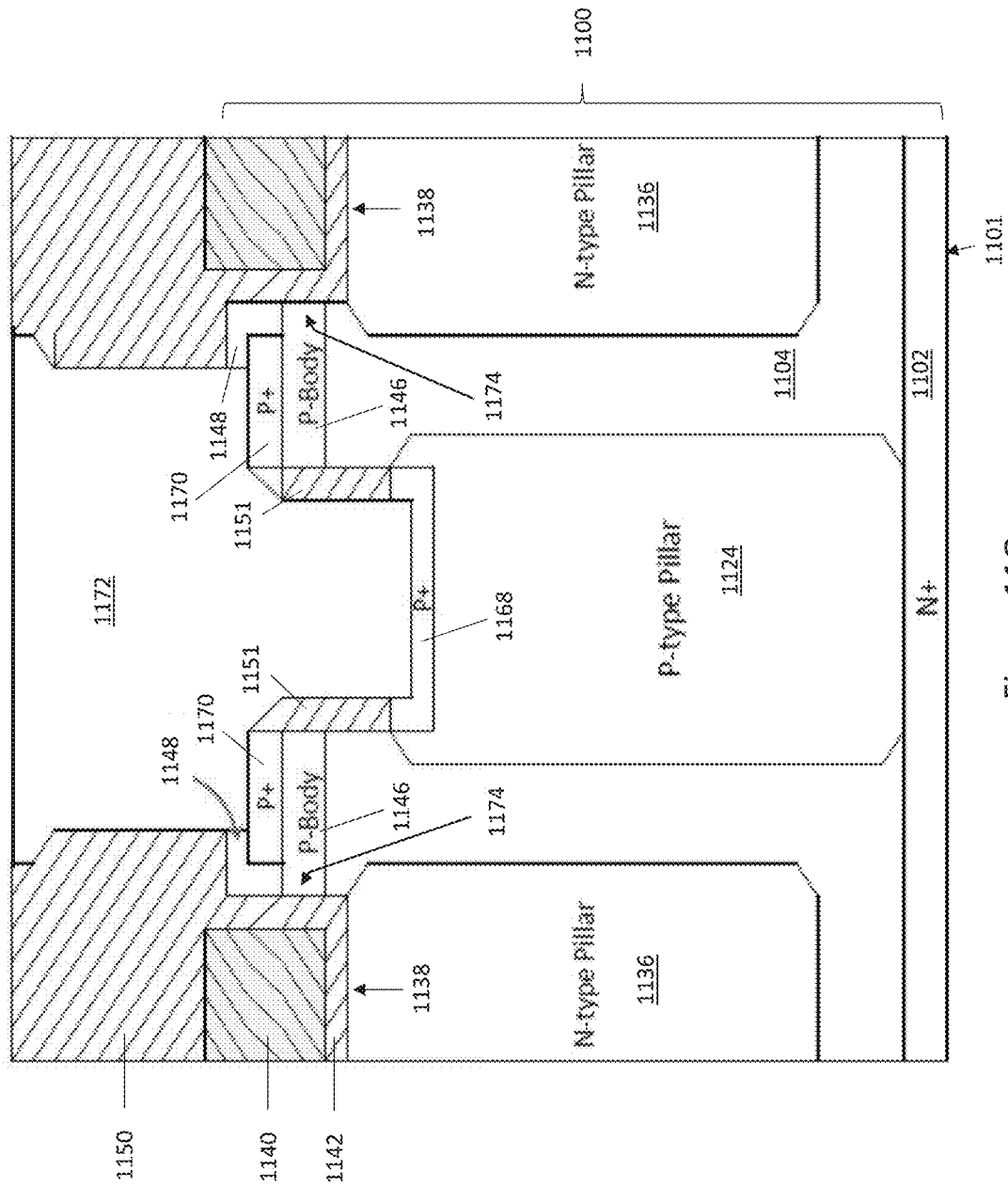

FIGS. 11A through 11Q illustrate an embodiment of a method of manufacturing the semiconductor device 1000 shown in FIG. 10.

FIG. 11A shows a semiconductor substrate 1100 with an n+region 1102 at the back surface 1101 of the substrate 1000 and a 11-region 1104 adjoining the n+ region 1102. The semiconductor substrate 1100 can comprise any type of semiconductor material such as a single element semiconductor (e.g. Si, Ge, etc.), silicon-on-insulator, a binary semiconductor (e.g. SiC, GaN, GaAs, etc.), a ternary semiconductor, etc. with or without epitaxial layer(s). The n-region 1104 can be formed, e.g., as part of an epitaxial layer. A hard mask 1106 is formed on the front surface 1103 of the semiconductor substrate 1100. An opening 1108 is etched through the hard mask 1106, e.g. using an anisotropic etch process, to expose part of the front surface 1103 of the semiconductor substrate 1100.

FIG. 11B shows the semiconductor substrate 1100 after the part of the semiconductor substrate 1100 exposed by the opening 1108 in the hard mask 1106 is recessed below the front surface 1103 of the substrate 1100. The depth of the recess 1110 can vary based on the application.

FIG. 11C shows the semiconductor substrate 1100 after the hard mask 1106 is removed and a spacer oxide 1112 is formed on the front surface 1103 of the substrate 1100. An opening 1114 is etched through the spacer oxide 1112 to expose part of the recessed surface 1110 of the semiconductor substrate 1100.

FIG. 11D shows the semiconductor substrate 1100 after a groove 1116 is etched into the exposed part of the recessed surface 1110 of the semiconductor substrate 1100. The groove 1116 has sidewalls 1118 and a bottom 1120. The depth of the groove 1116 can vary depending on the application.

FIG. 11E shows the semiconductor substrate 1100 after a sacrificial oxide 1122 is formed on the sidewalls 1118 and bottom 1120 of the groove 1116 formed in the recessed surface 1110 of the semiconductor substrate 1100.

FIG. 11F shows the semiconductor substrate 1100 after a p-type pillar/column/stripe region 1124 is implanted into the n-layer 1104 through the bottom 1120 of the groove 1116 formed in the recessed surface 1110 of the semiconductor substrate 1100.

FIG. 11G shows the semiconductor substrate 1100 after the spacer oxide 1112 and the sacrificial oxide 1122 are removed and the recessed part of the substrate 1100 is filled with an oxide 1126. The spacer oxide 1112 and the sacrificial oxide 1122 are removed from the front surface 1103 of the semiconductor substrate 1100, e.g., by a CMP (chemical-mechanical polishing) process which stops on the semiconductor material of the substrate 1100.

FIG. 11H shows the semiconductor substrate 1100 after trenches 1128 are etched into the part of the substrate 1100 not protected by the sacrificial oxide 1126. Each trench 1128 has sidewalls 1130 and a bottom 1132.

FIG. 11I shows the semiconductor substrate 1100 after a sacrificial oxide 1134 is formed on the sidewalls 1130 and bottom 1132 of the trenches 1128.

FIG. 11J shows the semiconductor substrate 1100 after an n-type pillar/column/stripe region 1136 is implanted into the n-layer 1104 through the bottom 1132 of each trench 1128. In one embodiment, the p-type pillar/column/stripe regions 1124 extend to the n+layer 1102 at the back surface 1101 of the semiconductor substrate whereas the n-type pillar/column/stripe regions terminate in the n-layer before reaching the n+layer.

FIG. 11K shows the semiconductor substrate 1100 after the sacrificial oxide 1134 is removed, a gate oxide is formed on the sidewalls 1130 and bottom 1132 of each trench 1128, and each trench 1128 is filled with an electrically conductive material such as doped polysilicon. The gate oxide and electrically conductive material are planarized, e.g., by a CMP (chemical-mechanical polishing) process which stops on the semiconductor material of the substrate 1100. The resulting trench structures form gate trenches 1138, each of which includes a gate electrode 1140 and a gate dielectric 1142 in the trench 1138, the gate dielectric 1142 separating the gate electrode 1140 from the semiconductor substrate 1100.

FIG. 11L shows the semiconductor substrate 1100 after the front surface of the substrate 1100 is recessed, e.g, by dry and/or wet etching, between the gate trenches 1138 to recess the n-layer 1104 in this region of the substrate 1100. Also, the gate electrodes 1140 are covered with an oxide 1144.

FIG. 11M shows the semiconductor substrate 1100 after p-type body regions 1146 and n-type source/emitter regions 1148 are formed in the n-layer 1104 between the gate trenches 1138. P-type dopants are implanted into the semiconductor substrate 1100 between the gate trenches 1138 and annealed to form the p-type body regions 1146, and n-type dopants are implanted between the gate trenches 1138 and annealed to form the source/emitter regions 1148.

FIG. 11N shows the semiconductor substrate 1100 after an interlayer dielectric 1150 is formed on the front surface of the semiconductor substrate 1100, an opening 1152 is formed in the interlayer dielectric 1150 and a groove 1154 is etched into the part of the semiconductor substrate 1100 exposed by the opening 1152 in the interlayer dielectric 1150. The opening 1152 in the interlayer dielectric 1150 is wider than the contact groove 1154 etched in the semiconductor substrate 1100. The interlayer dielectric material is removed from the part of the front face 1156 of the source/emitter regions 1148 closest to the contact groove 1154 and from the side faces 1158 of the source/emitter regions 1148 facing toward the contact groove 1154, exposing these faces 1156, 1158 of the source/emitter regions 1148. The interlayer dielectric material remains on the sidewalls 1160 of the contact groove 1154 below the source/emitter regions 1148 to form dielectric spacers 1151, but is removed from the bottom 1162 of the contact groove 1154.

FIG. 11O shows the semiconductor substrate 1100 after the exposed surfaces 1156, 1158 of the source/emitter regions 1148 are etched away so as to laterally recess each source/emitter region 1148 in a direction toward the neighboring gate trench 1138, thereby exposing the part of the front face 1164 of the body regions 1146 closest to contact groove 1166.

FIG. 11P shows the semiconductor substrate 1100 after p-type dopants are implanted into the exposed parts of the substrate 1100 and subsequently annealed to form a first highly-doped (e.g. p+) body contact region 1168 at the bottom of each contact groove 1166 and a second highly-doped (e.g. p+) body contact region 1170 in the exposed part of the front face 1164 of each body region 1146 closest to the corresponding contact groove 1166.

FIG. 11Q shows the semiconductor substrate 1100 after an electrically conductive material 1172 such is metal is deposited over the substrate to fill the contact openings 1166. The electrically conductive material adjoins the recessed part of the semiconductor substrate 1100, and is planarized e.g. by a CMP process. The semiconductor device regions illustrated in FIGS. 11A through 11Q are shown as device regions of an n-channel device, but the conductivity types of the device regions can be reversed to instead realize a p-channel device.

The superjunction charge-balance structure formed by the p-type and n-type pillars/columns/stripes 1124, 1136 results in reduced on-resistance while maintaining required breakdown voltage. By providing dielectric spacers 1151 in the body contact openings to separate the channel regions 1174 from the underlying p-type pillars/columns/stripes 1124, the width needed for the p-type pillars/columns/stripes 1124 can be reduced which in turn decreases the energy levels needed to implant the p-type pillars/columns/stripes 1124 which are used to form a superjunction structure and achieve charge balance. With a deep body contact opening and the contact trench with underlying p-type pillars/columns/stripes, the required voltage can be sustained while also relocating the impact ionization location to the vicinity of the p-type pillars/columns/stripes. Such a construction causes a greater portion of avalanche current to go directly through the p-type pillars/columns/stripes and disperse to the source metal, and by doing so, effectively avoids high current density surrounding the source/emitter region and subsequent turn on the parasitic BJT which could otherwise destroy the device. The depth of the gate trenches 1138 can be varied to adjust gate charge and gate resistance.

Figure 12:
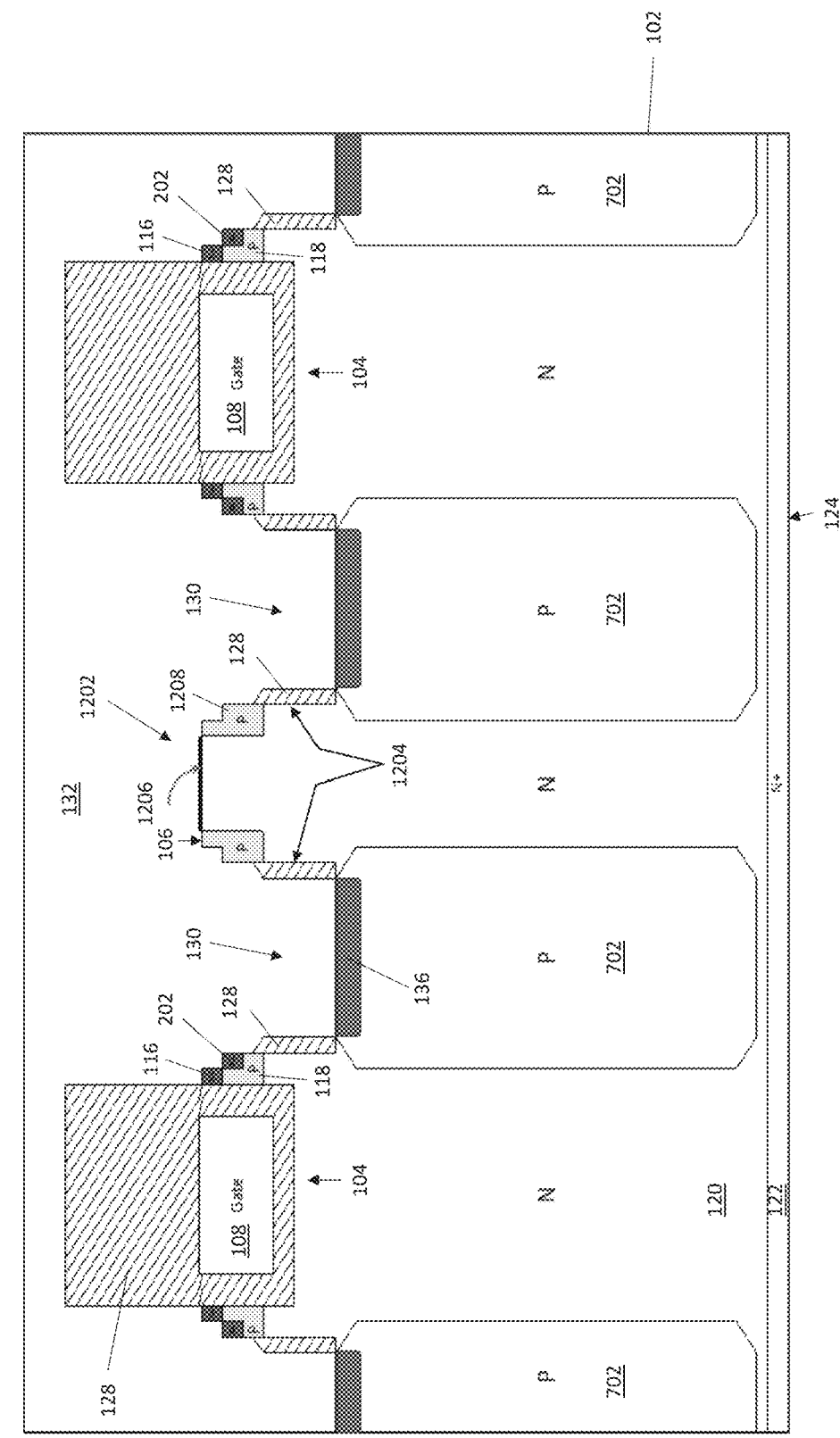
FIG. 12 illustrates a partial cross-sectional view of an embodiment of a semiconductor device having body contacts with dielectric spacers and integrated Schottky barrier diodes.

FIG. 12 illustrates a partial cross-sectional view of an embodiment of a semiconductor device 1200 having body contacts with dielectric spacers. The embodiment shown in FIG. 12 is similar to the embodiments shown in FIGS. 10 and 11O. Different, however, the semiconductor device 1200 also includes a Schottky barrier diode 1202 formed in the semiconductor substrate 102 between adjacent body contact openings/grooves 130 formed in the substrate 102. The Schottky barrier diode 1202 is spaced apart from each neighbouring gate trench 104 by a respective contact opening/groove 130 extending along each longitudinal side of the Schottky barrier diode 1202. One sidewall 1204 of the semiconductor substrate 102 formed by each adjacent contact opening/groove 130 adjoins the Schottky barrier diode 1202, The Schottky barrier diode 1202 includes a Schottky contact 1206 on the front face 106 of the semiconductor substrate 102 between the neighbouring contact openings/grooves 130 formed in the substrate 102. Any suitable metal or metal silicide can be used for the Schottky contact 1206. A guard ring 1208 of p+ semiconductor material can be provided around the edge of the Schottky barrier diode 1202, surrounding the Schottky contact 1206. The guard ring 1208 drives the adjacent semiconductor region into avalanche breakdown before the Schottky junction is damaged by large levels of reverse current flow during transient events.

The Schottky barrier diode 1202 has low leakage, low forward voltage and when merged with a power MOSFET, low reverse recovery charge Qrr. Gate trenches 104 with underlying superjunction structures formed by pillar/column/stripe region 702 of the second conductivity type and the drift region 120 of the first conductivity type flank both the gate regions and the diode mesas. The superjunction structures underneath the body contacts 136 at the bottom of the contact openings/grooves 130 reduce leakage when the device 1200 is off at both the Schottky barrier and at the body diode of the transistor. The conductivity types of the device regions can be reversed in FIG. 12 to realize p-channel devices instead of n-channel devices.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc, and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a, " "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A semiconductor device, comprising:
a trench extending into a first main surface of a semiconductor substrate;
a gate electrode and a gate dielectric in the trench, the gate dielectric separating the gate electrode from the semiconductor substrate;
a source region having a first conductivity type formed in the semiconductor substrate at the first surface and adjacent the trench;

a body region having a second conductivity type opposite the first conductivity type and formed in the semiconductor substrate below the source region and adjacent the trench, the body region adjoining the source region;

a drift region having the first conductivity type formed in the semiconductor substrate below the body region and adjacent the trench, the drift region adjoining the body region;

a contact opening in the semiconductor substrate which extends into the body region;

an electrically insulative spacer on sidewalls of the semiconductor substrate formed by the contact opening;

an electrically conductive material in the contact opening and adjoining the electrically insulative spacer on the sidewalls of the semiconductor substrate formed by the contact opening; and a body contact region of the second conductivity type formed on a section of the body region adjacent the contact opening, wherein the source region adjoins a side surface of the body contact region of the second conductivity type facing the trench and extends onto a front surface of the body contact region of the second conductivity type, wherein the body contact region is in ohmic contact with the electrically conductive material at the front surface of the body contact region, wherein the semiconductor substrate is free of device channels along the sidewalls formed by the contact opening.

2. The semiconductor device of claim 1, wherein the electrically insulative spacer is recessed below the first main surface of the semiconductor substrate along the sidewalls of the semiconductor substrate formed by the contact opening.

3. The semiconductor device of claim 1, wherein the contact opening terminates within the body region so that the electrically conductive material is separated from the drift region by a section of the body region.

4. The semiconductor device of claim 3, further comprising an additional region of the second conductivity type formed in the body region adjacent a bottom of the contact opening, wherein the additional region is doped more heavily than the body region and adjoins the electrically conductive material at the bottom of the contact opening.

5. The semiconductor device of claim 1, wherein the contact opening extends through the body region and into the drift region so that the electrically conductive material extends into the drift region.

6. The semiconductor device of claim 5, further comprising a first additional region of the second conductivity type formed in the drift region and adjoining the electrically conductive material at a bottom of the contact opening.

7. The semiconductor device of claim 6, further comprising a second additional region of the second conductivity type formed in the drift region, wherein the second additional region of the second conductivity type adjoins the first additional region of the second conductivity type below the bottom of the contact opening and extends to a greater depth in the semiconductor substrate as measured from the first main surface than both the trench and the first additional region of the second conductivity type, and wherein the first additional region of the second conductivity type is doped more heavily than the second additional region of the second conductivity type.

8. The semiconductor device of claim 7, further comprising a first additional region of the first conductivity type formed at a second main surface of the semiconductor substrate opposite the first main surface, wherein the first additional region of the first conductivity type is doped more heavily than the drift region, and wherein the second additional region of the second conductivity type extends to and adjoins the first additional region of the first conductivity type.

9. The semiconductor device of claim 8, further comprising a second additional region of the first conductivity type formed in the drift region under the trench, wherein the first additional region of the first conductivity type is doped more heavily than the second additional region of the first conductivity type, and wherein the second additional region of the second conductivity type is laterally separated from the second additional region of the first conductivity type by a section of the drift region.

10. The semiconductor device of claim 9, wherein the second additional region of the first conductivity type extends to and adjoins the first additional region of the first conductivity type.

11. The semiconductor device of claim 9, further comprising a field plate in the trench below the gate electrode, wherein the field plate is electrically insulated from the gate electrode.

12. The semiconductor device of claim 1, wherein a section of the body region extends to the first main surface of the semiconductor substrate, wherein the source region is disposed laterally between the trench and the section of the body region that extends to the first main surface of the semiconductor substrate, and wherein the contact opening is formed in the section of the body region that extends to the first main surface of the semiconductor substrate.

13. The semiconductor device of claim 12, wherein the electrically insulative spacer is recessed below the first main surface of the semiconductor substrate along sidewalls of the section of the body region that extends to the first main surface of the semiconductor substrate so that an upper part of the sidewalls is devoid of the electrically insulative spacer.

14. The semiconductor device of claim 13, wherein the body contact region adjoins the electrically conductive material along the upper part of the sidewalls devoid of the electrically insulative spacer.

15. The semiconductor device of claim 14, wherein the contact opening extends through the body region and into the drift region so that the electrically conductive material extends into the drift region.

16. The semiconductor device of claim 15, further comprising an additional region of the second conductivity type formed in the drift region, doped more heavily than the body region and adjoining the electrically conductive material at a bottom of the contact opening.

17. The semiconductor device of claim 14, wherein the contact opening terminates within the body region so that the electrically conductive material is separated from the drift region by a section of the body region.

18. The semiconductor device of claim 17, further comprising an additional region of the second conductivity type formed in the body region adjacent a bottom of the contact opening, doped more heavily than the body region and adjoining the electrically conductive material at the bottom of the contact opening.

19. The semiconductor device of claim 1, further comprising an interlayer dielectric on the first main surface of the semiconductor substrate, wherein the contact opening extends through the interlayer dielectric and into the semiconductor substrate, and wherein a width of the contact opening is larger in the interlayer dielectric than in the semiconductor substrate so that the electrically conductive material has a stepped profile in the contact opening.

20. The semiconductor device of claim 1, further comprising an interlayer dielectric on the first main surface of the semiconductor substrate, wherein the contact opening extends through the interlayer dielectric and into the semiconductor substrate, and wherein the electrically insulative spacer extends onto the first main surface of the semiconductor substrate and along sidewalls of the interlayer dielectric formed by the contact opening.

21. The semiconductor device of claim 1, wherein the electrically insulative spacer comprises oxide, nitride, carbon or tetraethoxysilane.

22. The semiconductor device of claim 1, wherein a part of the first main surface of the semiconductor substrate is recessed in a region adjacent the contact opening, and wherein the electrically conductive material adjoins the recessed part of the first main surface.

23. The semiconductor device of claim 1, further comprising a Schottky barrier diode formed in the semiconductor substrate at a side of the contact opening opposite the trench so that the Schottky barrier diode is spaced apart from the trench by the contact opening, wherein one of the sidewalls of the semiconductor substrate formed by the contact opening adjoins the Schottky barrier diode.

24. The semiconductor device of claim 23, further comprising:
a first additional region of the first conductivity type formed at a second main surface of the semiconductor substrate opposite the first main surface; and
a first additional region of the second conductivity type formed in the drift region under the contact opening and extending to the first additional region of the first conductivity type,
wherein the first additional region of the first conductivity type is doped more heavily than the drift region.

25. The semiconductor device of claim 24, further comprising:
an additional contact opening in the semiconductor substrate at a side of the Schottky barrier diode facing away from the trench; and
a second additional region of the second conductivity type formed in the drift region under the additional contact opening and extending to the first additional region of the first conductivity type.

26. The semiconductor device of claim 1, wherein the electrically insulative spacer is recessed below the first main surface of the semiconductor substrate along sidewalls of the source region, wherein the body contact region of the second conductivity type is adjacent the sidewalls of the source region.

27. The semiconductor device of claim 1, further comprising a superjunction structure formed in the semiconductor substrate below the trench and the contact opening.

28. The semiconductor device of claim 27, further comprising:
a contact region of the second conductivity type below a bottom of the contact opening;
a pillar, column, or stripe region of the second conductivity type formed in the drift region and adjoining the contact region below the bottom of the contact opening; and
a pillar, column, or stripe region of the first conductivity type laterally separated from the pillar, column, or stripe region of the second conductivity type by a section of the drift region,
wherein the pillar, column, or stripe region of the second conductivity type and the pillar, column, or stripe region of the first conductivity type form part of the superjunction structure.

* * * * *